United States Patent
Tokunaga

(10) Patent No.: US 8,735,885 B2
(45) Date of Patent: May 27, 2014

(54) ANTIFUSE MEMORY DEVICE

(75) Inventor: Hajime Tokunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1062 days.

(21) Appl. No.: 12/327,406

(22) Filed: Dec. 3, 2008

(65) Prior Publication Data

US 2009/0152549 A1 Jun. 18, 2009

(30) Foreign Application Priority Data

Dec. 14, 2007 (JP) ................................. 2007-323241

(51) Int. Cl.
*H01L 29/04* (2006.01)
*H01L 23/52* (2006.01)

(52) U.S. Cl.
USPC ............................. 257/50; 257/209; 257/529

(58) Field of Classification Search
USPC .......................................... 257/50, 209, 529
See application file for complete search history.

(56) References Cited

U.S. PATENT DOCUMENTS

| | | | | |
|---|---|---|---|---|
| 5,166,556 A | * | 11/1992 | Hsu et al. .......................... | 326/41 |
| 5,426,614 A | | 6/1995 | Harward | |
| 5,464,790 A | * | 11/1995 | Hawley .......................... | 438/600 |
| 5,468,680 A | * | 11/1995 | Cohen .......................... | 438/467 |
| 5,825,694 A | | 10/1998 | Okimoto et al. | |
| 5,835,419 A | | 11/1998 | Ichimura et al. | |
| 5,986,915 A | | 11/1999 | Okimoto et al. | |
| 5,994,757 A | * | 11/1999 | Ichikawa et al. .............. | 257/530 |
| 6,051,851 A | | 4/2000 | Ohmi et al. | |
| 6,631,085 B2 | * | 10/2003 | Kleveland et al. ............ | 365/175 |
| 6,690,597 B1 | | 2/2004 | Perlov et al. | |
| 6,946,719 B2 | * | 9/2005 | Petti et al. ...................... | 257/530 |
| 6,982,899 B2 | | 1/2006 | Sumitani et al. | |
| 7,349,248 B2 | | 3/2008 | Kawazu et al. | |
| 7,663,915 B2 | | 2/2010 | Kato | |
| 7,745,827 B2 | | 6/2010 | Asami | |

(Continued)

FOREIGN PATENT DOCUMENTS

| | | |
|---|---|---|
| CN | 1169016 | 12/1997 |
| CN | 1519861 | 8/2004 |

(Continued)

OTHER PUBLICATIONS

Chinese Office Action (Application No. 200810190316.6;CN11150) Dated Jan. 18, 2013.

(Continued)

*Primary Examiner* — James Mitchell
(74) *Attorney, Agent, or Firm* — Nixon Peabody LLP; Jeffrey L. Costellia

(57) ABSTRACT

A memory device is provided, which includes a memory element including a first electrode, a second electrode, and a silicon layer disposed between the first electrode and the second electrode. The memory element is capable of being in a first state, a second state, and a third state. A first data is written to the memory element being in the first state so that a potential of the first electrode is higher than a potential of the second electrode, whereby the memory element being in the second state is obtained. A second data is written to the memory element being in the first state so that a potential of the second electrode is higher than a potential of the first electrode, whereby the memory element being in the third state is obtained.

19 Claims, 9 Drawing Sheets

(56) References Cited

U.S. PATENT DOCUMENTS

| | | |
|---|---|---|
| 8,193,606 B2 | 6/2012 | Kato et al. |
| 2003/0062594 A1* | 4/2003 | Chen .............................. 257/530 |
| 2003/0164494 A1* | 9/2003 | Lee ................... 257/20 |
| 2004/0108573 A1* | 6/2004 | Herner |
| 2005/0121742 A1* | 6/2005 | Petti et al. |
| 2006/0291315 A1 | 12/2006 | Andre et al. |
| 2007/0258285 A1 | 11/2007 | Kawazu et al. |
| 2008/0006903 A1* | 1/2008 | Akimoto ...................... 257/529 |
| 2008/0025061 A1 | 1/2008 | Scheuerlein et al. |
| 2008/0043509 A1 | 2/2008 | Schmitt et al. |
| 2008/0083954 A1 | 4/2008 | Tokunaga |
| 2008/0101108 A1 | 5/2008 | Tokunaga et al. |
| 2008/0116500 A1 | 5/2008 | Tokunaga |
| 2008/0212361 A1* | 9/2008 | Bertin et al. |
| 2008/0224140 A1 | 9/2008 | Tokunaga et al. |
| 2008/0224229 A1 | 9/2008 | Tajima et al. |
| 2009/0001347 A1* | 1/2009 | Kumar et al. ..................... 257/4 |
| 2009/0003082 A1* | 1/2009 | Meeks et al. ............. 365/185.28 |
| 2009/0154262 A1 | 6/2009 | Tokunaga |

FOREIGN PATENT DOCUMENTS

| | | |
|---|---|---|
| EP | 0 680 087 A2 | 11/1995 |
| EP | 0 793 176 A2 | 9/1997 |
| EP | 0 797 211 A1 | 9/1997 |
| EP | 0 915 421 A2 | 5/1999 |
| EP | 0 953 983 A2 | 11/1999 |
| EP | 1 970 956 A2 | 9/2008 |
| JP | 60-117660 | 6/1985 |
| JP | 07-297293 | 11/1995 |
| JP | 2005-045282 | 2/2005 |
| JP | 2005-259334 | 9/2005 |
| JP | 2005-289634 | 10/2005 |
| JP | 2006-270059 | 10/2006 |
| JP | 2007-123864 | 5/2007 |
| JP | 2007-281332 | 10/2007 |
| JP | 2008-258598 | 10/2008 |
| WO | WO-2005/076281 A1 | 8/2005 |

OTHER PUBLICATIONS

Chinese Office Acton (Application No. 2008010190316.6;CN11150) Dated Oct. 11, 2013.

* cited by examiner

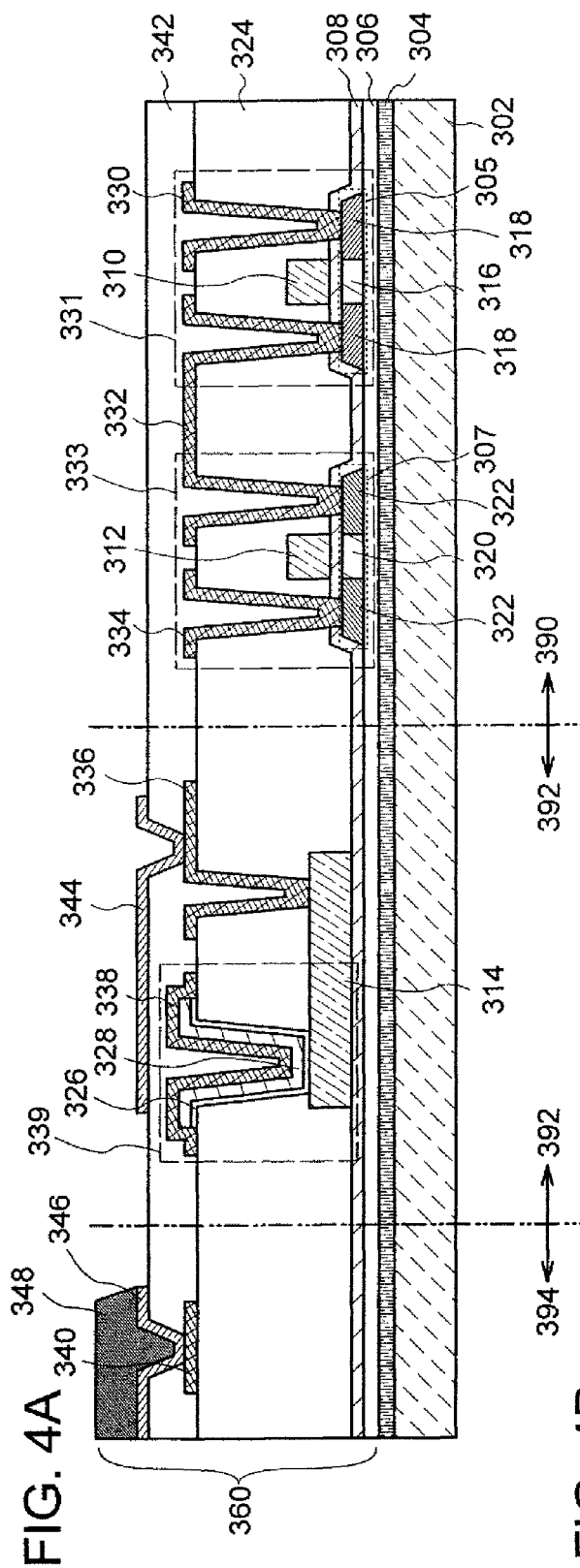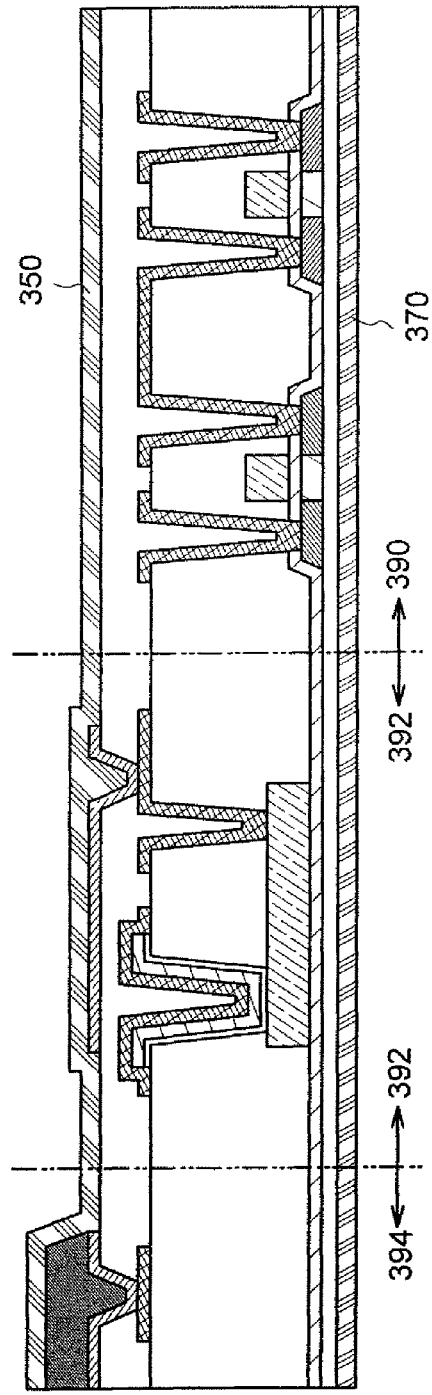

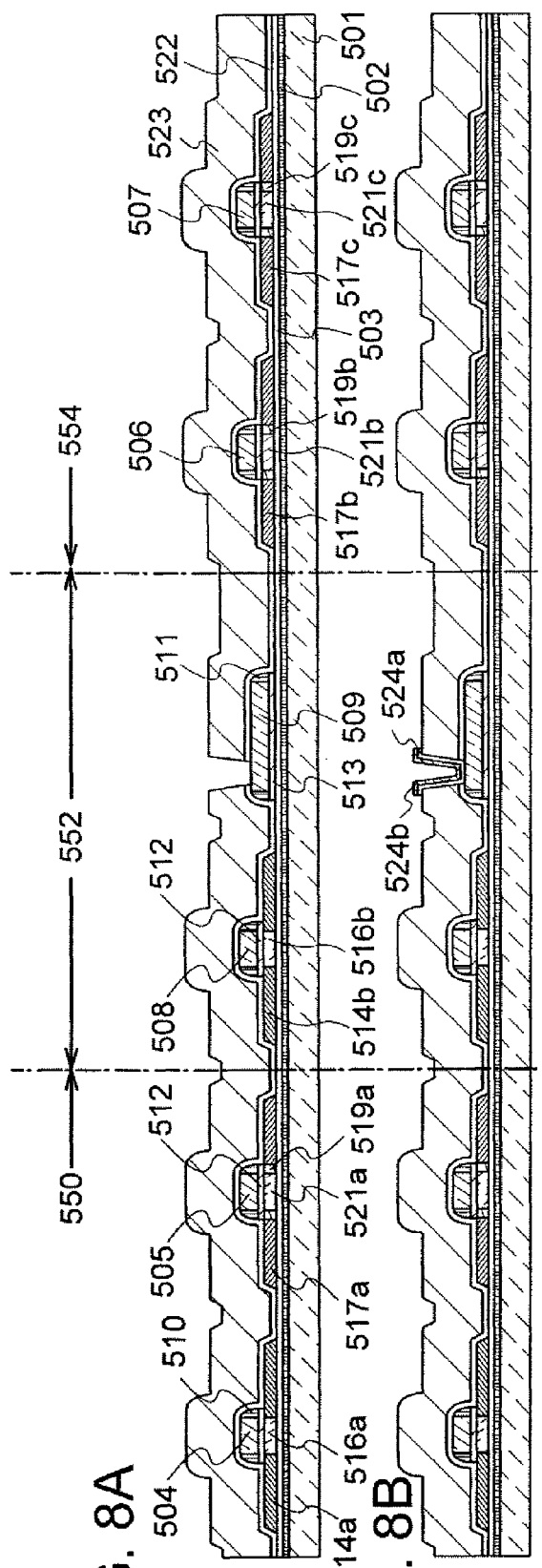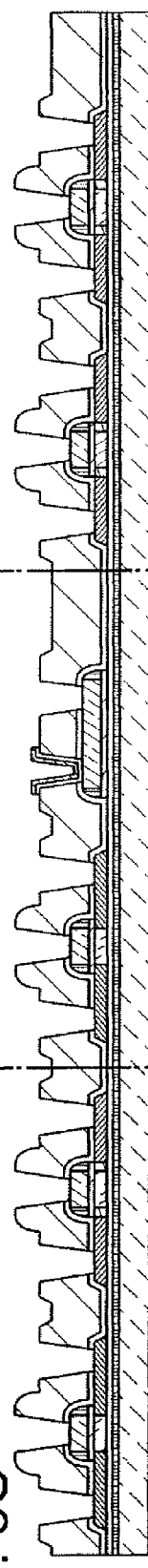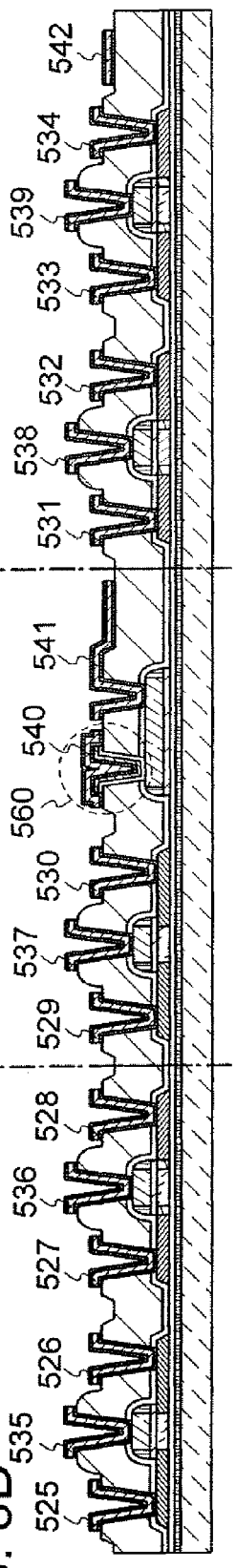

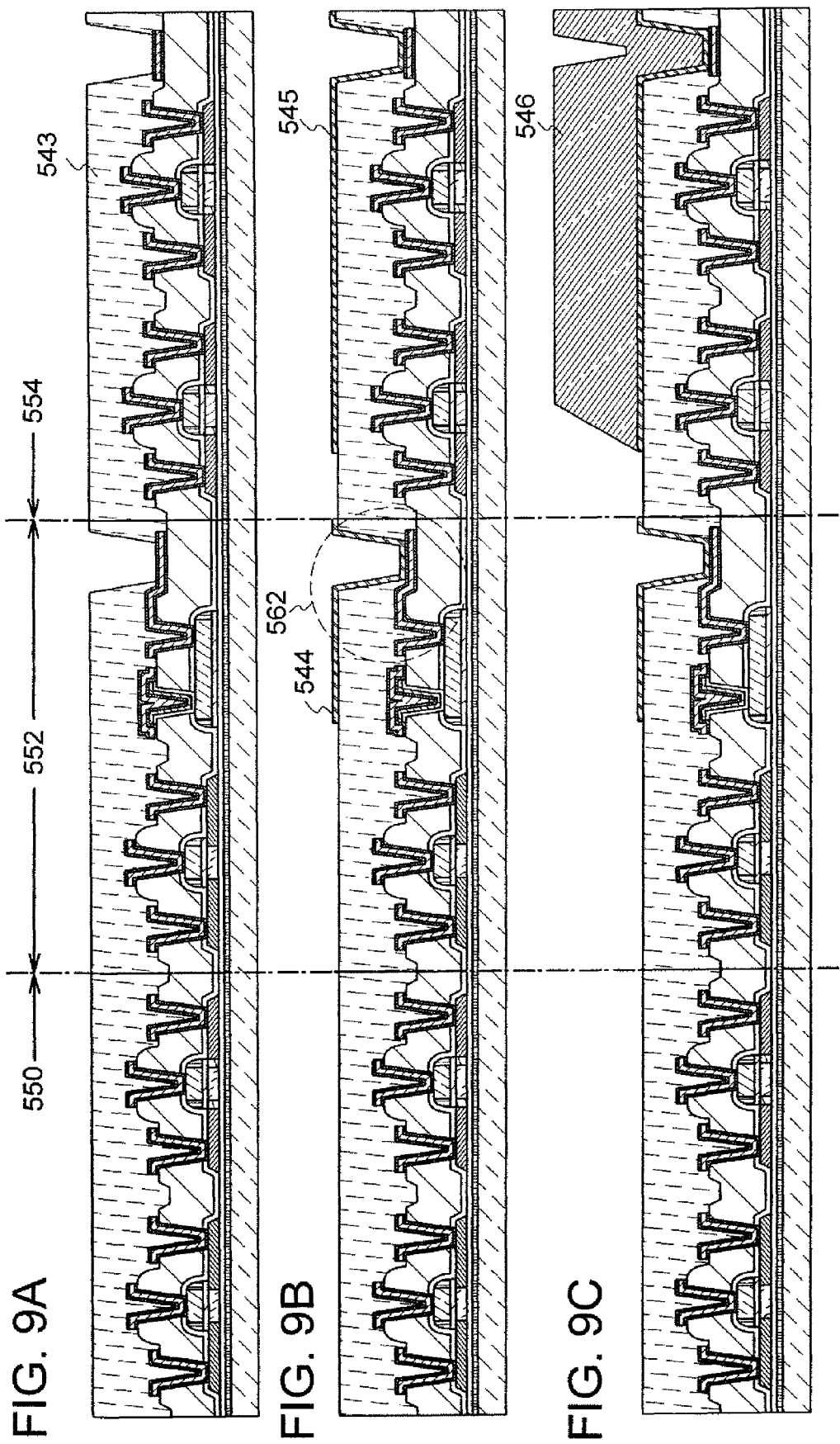

ANTIFUSE MEMORY DEVICE

BACKGROUND OF THE INVENTION

1. Field of the Invention

The present invention relates to memory and a semiconductor device including the memory, in particular relates to antifuse type memory. Further, the present invention relates to a semiconductor device which can perform writing and reading of data by radio.

2. Description of the Related Art

A technique called radio frequency identification (RFID) has attracted attention and has been applied to various fields such as distribution, historical management, article management, presence management, or the like. RFID refers to data communication using a radio communication technique in a restricted sense. Radio communication is performed between an RFID tag (also referred to as an RF tag, an ID tag, an IC tag, or a radio tag) and a reader/writer, so that writing and reading of data can be performed.

In recent years, use of RFID at the airport has been considered, and as an example thereof, a baggage handling system can be given. For example, Patent Document 1 (Japanese Published Patent Application No. 2005-289634) discloses a system by which baggage of users (passengers) is managed using RFID. Specifically, an RFID tag is attached to baggage, necessary data (a name, an address, an inspection result and the like of a user) is written into the RFID tag as needed, and the data written into the RFID tag is read and managed, whereby security or convenience is improved.

SUMMARY OF THE INVENTION

Data which is to be written into an RFID tag is written into memory mounted on the RFID tag. In the case where RFID is applied to handling of baggage, in order to prevent loss, theft, or the like of baggage, it is preferable that data which has been written once can not be rewritten. Therefore, it is preferable to mount write-once memory which can perform reading and one-time writing.

As write-once memory, a fuse type element such as a fuse or an antifuse is known, which allows data writing by control of a conductive state and a non-conductive state. An antifuse is in a non-conductive state at the time of manufacture and the state of the antifuse is changed to a conductive state by applying an electric signal of greater than or equal to a predetermined threshold. In general, in the case of using an antifuse as memory, a non-conductive state at the time of manufacture, that is, an initial state (a high resistance state) corresponds to one of the binary data, and a conductive state obtained after writing is performed (a low resistance state) corresponds to the other of the binary data.

However, by application of an electric signal of greater than or equal to a threshold to an antifuse in the non-conductive state after predetermined data is written into memory, the state of the antifuse can be changed to the conductive state. Therefore, in the case of applying such an antifuse to handling of baggage such as a baggage handling system, there is concern that security or safety is reduced due to theft of baggage by falsifying data, mounting of a dangerous article on a plane, or the like.

In view of the foregoing problem, it is an object of the present invention to provide memory and a semiconductor device in which falsification of written data is prevented. It is another object of the present invention to provide write-once read-many memory where data can be newly written as needed after manufacturing memory or after manufacturing a semiconductor device. It is still another object of the present invention to provide a radio chip provided with write-once read-many memory having a structure in which falsification of data is prevented.

Memory includes a plurality of antifuses (also referred to as antifuse elements or memory elements). An antifuse is in one state selected from "a first state", "a second state", and "a third state". "The first state" is an initial state of an antifuse, and each of "the second state" and "the third state" is a state where data is written into the antifuse.

"The second state" and "the third state" of the antifuses are obtained by writing data into the antifuse in "the first state". The state of the antifuse in "the second state" is not changed to any of the other states even when writing is performed. Similarly, the state of the antifuse in "the third state" is not changed to any of the other states even when writing is performed. That is, the present antifuse has a characteristic in that "the first state" is changed to "the second state" or "the third state" by writing, but "the second state" is not changed to "the first state" or "the third state" even when writing is performed and "the third state" is not changed to "the first state" or "the second state" even when writing is performed.

Data is written into the antifuse included in the memory, in blocks or in antifuses. It is distinguished in blocks or in antifuses whether or not data has been written into the memory. An antifuse which is placed in a block where data has been written or an antifuse where data has been written is inevitably in either "the second state" or "the third state". In the case of distinguishing in blocks, memory may include one block or a plurality of blocks. Further, a block may include one antifuse or a plurality of antifuses.

By forming memory as described above, the state of an antifuse of a block where data has been written is not changed to any of the other states; thus, it becomes impossible to rewrite data. Further, by including an antifuse in "the first state" in a block where data has not been written, it becomes possible to additionally write data. Furthermore, data is additionally written into a block where data has not been written which includes an antifuse in "the first state", so that the states of all the antifuses which are placed in the block are changed to either "the second state" or "the third state". After the change, data has been written into the block. Therefore, the antifuse of the block where data has been written by additional writing is in either "the second state" or "the third state", and thus it becomes impossible to rewrite the data.

One feature of the present invention is memory provided with an antifuse having one state selected from "a first state", "a second state", or "a third state". The antifuse has the following characteristic: the state of the antifuse in "the first state" is changed to "the second state" or "the third state" by writing, the state of the antifuse in "the second state" is not changed to "the first state" or "the third state" even when writing is performed, and the state of the antifuse in "the third state" is not changed to "the second state" or "the first state" even when writing is performed. Further, "the second state" and "the third state" are made to correspond to binary data "0" and "1" or "1" and "0".

Another feature of the present invention is memory provided with an antifuse having one state selected from "a first state", "a second state", or "a third state". The state of the antifuse in "the first state" is changed to "the second state" in the case of performing writing by a first writing method, or is changed to "the third state" in the case of performing writing by a second writing method. The state of the antifuse in "the second state" is not changed to "the first state" or "the third state" even when writing is performed, and the state of the antifuse in "the third state" is not changed to "the first state"

or "the second state" even when writing is performed. Further, "the second state" and "the third state" are made to correspond to binary data "0" and "1", so that data is written.

In the above structure, a first writing method is a method of applying voltage in a first direction, and a second writing method is a method of applying voltage in a second direction opposite to the first direction.

In the above-described structure, the antifuse has an element structure the state of which is changed from "the first state" to "the second state" or "the third state".

"The first state", "the second state", and "the third state" of the antifuse are different from each other in an electric resistance. Further, the electric resistances of "the first state", "the second state", and "the third state" of the antifuse be in descending order. That is, R1>R2>R3 is satisfied, where the electric resistance of the antifuse in "the first state" is R1, the electric resistance of the antifuse in "the second state" is R2, and the electric resistance of the antifuse in "the third state" is R3.

Further, in the above-described structure, it is possible to make the antifuse have a structure including a first electrode, a second electrode, and a resistance material layer which is a stacked film of a silicon layer and an insulating layer between the first electrode and the second electrode.

Another feature of the present invention is a semiconductor device including memory having a plurality of antifuses, a driver circuit having a plurality of thin film transistors, and an antenna. One feature of the antifuse is that the antifuse is in one state selected from "a first state", "a second state", or "a third state", and in the case where the antifuse is in "the first state", the state of the antifuse is changed to "the second state" or "the third state" by performing writing. The antifuse in "the second state" has a characteristic in that the state is not changed to "the first state" or "the third state" even when writing is performed. Further, the antifuse in "the third state" has a characteristic in that the state is not changed to "the second state" or "the first state" even when writing is performed. "The second state" and "the third state" are made to correspond to binary data "0" and "1" or "1" and "0".

Another feature of the present invention is a semiconductor device including memory having a plurality of antifuses, a driver circuit having a plurality of thin film transistors, and an antenna. The antifuse is in one state selected from "a first state", "a second state", or "a third state". The state of the antifuse in "the first state" is changed to "the second state" by performing writing by a first writing method, or is changed to "the third state" by performing writing by a second writing method. The antifuse in "the second state" has a characteristic in that the state is not changed to "the first state" or "the third state" even when writing is performed. Further, the antifuse in "the third state" has a characteristic in that the state is not changed to "the second state" or "the first state" even when writing is performed. "The second state" and "the third state" are made to correspond to "0" and "1", or "1" and "0" of binary data.

In the above-described structure, the first writing method can be a method of applying voltage in a first direction, and the second writing method can be a method of applying voltage in a second direction opposite to the first direction.

Further, in the above-described structure, an antifuse included in the memory has an element structure the state of which is changed from "the first state" to "the second state" or "the third state".

The electric resistances of "the first state", "the second state", and "the third state" of the antifuse be in descending order. That is, R1>R2>R3 is satisfied, where the electric resistance of the antifuse in "the first state" is R1, the electric resistance of the antifuse in "the second state" is R2, and the electric resistance of the antifuse in "the third state" is R3. Further, the electric resistances thereof are different from each other.

Further, the antifuse can include a first electrode, a second electrode, and a resistance material layer that is a stacked film of a silicon layer and an insulating layer between the first electrode and the second electrode.

In accordance with the present invention, write-once read-many memory where data cannot be rewritten can be realized. Therefore, memory can be realized in which falsification of data which is once written can be prevented and into which new data can be written as needed.

BRIEF DESCRIPTION OF THE DRAWINGS

In the accompanying drawings:

FIGS. 4A and 4B are cross-sectional views illustrating an example of a method for manufacturing a semiconductor device according to an aspect of the present invention;

FIGS. 8A to 8D are cross-sectional views illustrating steps for manufacturing a semiconductor device according to an aspect of the present invention; and FIGS. 9A to 9C are cross-sectional views illustrating steps for manufacturing a semiconductor device according to an aspect of the present invention.

DETAILED DESCRIPTION OF THE INVENTION

Embodiment Mode

Figure 1:
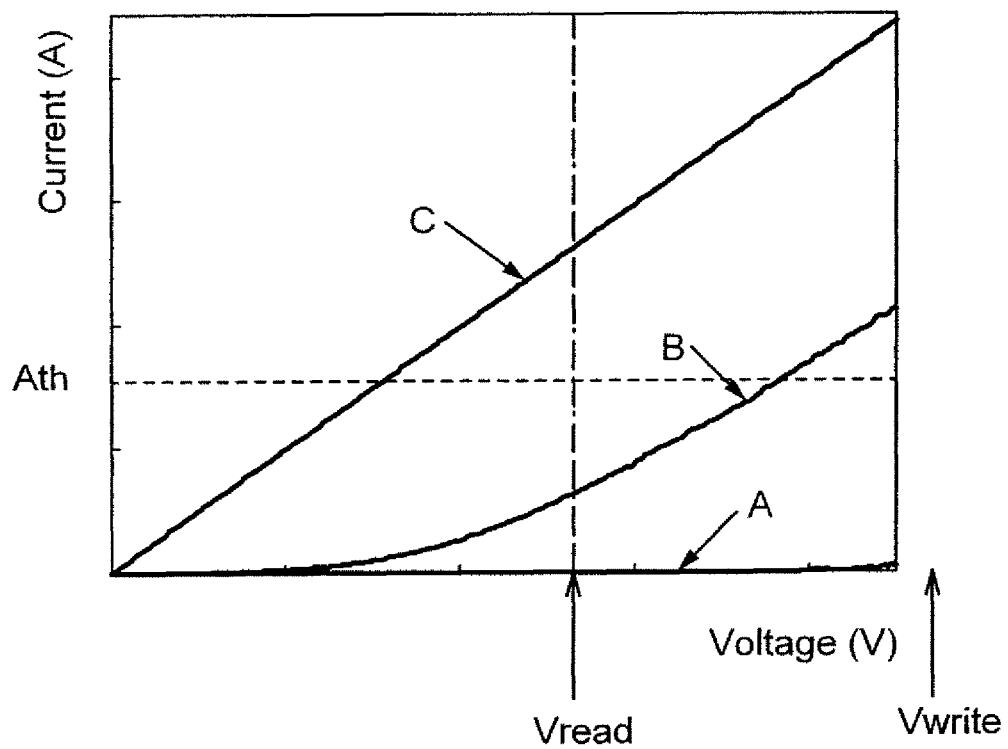
FIG. 1 is a graph illustrating an example of an electric characteristic of an antifuse according to an aspect of the present invention.

Embodiment modes of the present invention are described below. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of the embodiment modes given below. Note that the same reference numeral is commonly used to denote the same component among the different drawings in the structure of the present invention described below.

(Embodiment Mode 1)

An antifuse according to the present invention is in one state selected from "a first state", "a second state", or "a third state". "The first state", "the second state", and "the third state" are different from each other in an electric characteristic. One of the three states is an initial state at the time of manufacturing an antifuse, and the other two states are states in which data has been written by applying an electric signal to the antifuse. That is, the present antifuse may be in either one of the two writing states.

Further, memory according to the present invention includes a plurality of antifuses, and data is written into the memory in blocks or in antifuses. It is distinguished in blocks or in antifuses whether or not data has been written into the memory. One feature of the present invention is that an antifuse which is placed in a block where data has been written or an antifuse where data has been written is inevitably in either one of the two writing states, and that the two writing states correspond to binary data "0" and "1". In this embodiment mode, it is assumed that data is written into the antifuse in blocks and it is distinguished in blocks whether or not data has been written.

In this embodiment mode, the initial state of the antifuse is referred to as "the first state", and a state where data has been written into the antifuse is referred to as "the second state" or "the third state". The state of an antifuse in "the first state" is changed to "the second state" or "the third state" by writing. In other words, "the second state" and "the third state" of the present antifuse are two writing states that can be obtained by selecting a writing method or the like with respect to the antifuse in "the first state" which is the initial state. One feature of memory according to the present invention is to provide an antifuse having an element structure the state of which is changed from "the first state" to "the second state" or "the third state".

For example, when writing is performed by a first writing method, the state of the antifuse is changed from "the first state" to "the second state". On the other hand, when writing is performed by a second writing method, the state of the antifuse is changed from "the first state" to "the third state". "The second state" and "the third state" are two different writing states.

Note that the change from "the first state" to "the second state" and the change from "the first state" to the "the third state" are irreversible. Further, the state of an antifuse is not changed from "the second state" to "the third state" even if data is written into the antifuse in "the second state" by the second writing method. Similarly, the state of an antifuse in "the third state" is not changed from "the third state" to "the second state" even if data is written into the antifuse in "the third state" by the first writing method.

That is, the state of the antifuse in "the second state" and the state of the antifuse in "the third state" are not changed even if data is written thereto. Specifically, the antifuse according to the present invention has a characteristic in that the state is not changed from "the second state" to "the first state" or "the third state" and from "the third state" to "the first state" or "the second state". That is, in the antifuse according to the present invention, a change such as a change of "the first state"→"the second state" or a change of "the first state"→"the third state" occurs, but a change such as a change of "the second state"→"the first state", a change of "the third state"→"the first state", a change of "the second state"→"the third state", or a change of "the third state"→"the second state" does not occur. Note that a change of "the first state"→"the second state" refers to a change from a state on the left side of an arrow to a state on the right side of the arrow.

Data is written in blocks into the antifuses included in the memory, and it is distinguished in blocks whether or not data has been written. All the antifuses included in the memory may be regarded as one block or may be divided into a plurality of blocks. A method (means) for distinguishing blocks (or antifuses) is not limited in particular, and it is acceptable as long as it is distinguished whether or not data has been written. As a distinguishing method, a flag, a physical switch, or the like can be used. For example, a flag is placed in a block where data has been written, and it is detected in blocks whether or not the flag is placed. In the case where it is detected that the flag is placed, it can be judged that data has been written into the block. In the case where it is detected that the flag is not placed, it can be judged that data has not been written into the block. A specific antifuse in the block may be assigned to the flag. In the case where data has been written, data may be written into the specific antifuse. By performing writing on the flag in the block where data has been written, a flag "1" is placed, while the block where data has not been written remains as it is (remains in the initial state). Thus, it can be distinguished whether or not data has been written. Alternatively, in the case of using a physical switch, for example, a switch which is provided in a block where data has been written may be damaged and it may be distinguished whether or not data has been written by detecting in blocks whether or not the switch is damaged. The antifuse which is placed in the block where data has been written is inevitably in "the second state" or "the third state". Specifically, "0" of the binary data is made to correspond to "the second state", and "1" of the binary data is made to correspond to "the third state". Alternatively, "1" of the binary data is made to correspond to "the second state", and "0" of the binary data is made to correspond to "the third state". Needless to say, instead of distinguishing in blocks, it may be distinguished whether or not data has been written by providing each antifuse with a flag or a switch.

Next, the antifuse according to the present invention is described in terms of an electric characteristic. FIG. 1 shows an example of the current-voltage characteristic (hereinafter, also referred to as "I-V characteristic") of the present antifuse. A horizontal axis represents a voltage applied to the antifuse and a vertical axis represents a current value of the antifuse at that time. Note that FIG. 1 shows the I-V characteristic in the range of less than or equal to a breakdown voltage. Specifically, FIG. 1 shows the I-V characteristics of each of first, second, and third antifuse elements. Each of the first, second and third antifuse elements is an element in which a first electrode including tungsten formed over a substrate, an insulating layer including silicon oxynitride, an amorphous silicon layer, and a second electrode including titanium are stacked. The thickness of the first electrode, the insulating layer, the amorphous silicon layer, and the second electrode is 370 nm, 5 nm, 30 nm, and 200 nm, respectively. The first antifuse element is an element in which data is not written. The second antifuse element is an element in which data is written by applying 10V so that a potential of the second electrode is higher than a potential of the first electrode. The third antifuse element is an element in which data is written by applying 10V so that a potential of the first electrode is higher than a potential of the second electrode. The I-V characteristic of the first antifuse element is shown in a mode A in FIG. 1, the I-V characteristic of the second antifuse element is shown in a mode B in FIG. 1, and the I-V characteristic of the third antifuse element is shown in a mode C in FIG. 1.

FIG. 1 shows the mode A, the mode B, and the mode C. The mode A shows a high resistance state where little current flows even when a given voltage is applied. The mode C shows a low resistance state where a current flows in proportion to an applied voltage. The mode B shows a high resistance state where little current flows at a voltage of lower than a predetermined applied voltage and shows a low resistance state where current flows more at a voltage of higher than or equal to a predetermined applied voltage. The mode B shows a lower resistance state than the mode A and shows a higher resistance state than the mode C. These three characteristics correspond to "the first state", "the second state", and "the third state" of the present antifuses.

The antifuse at the time of manufacture (in the initial state) is in a non-conductive state. Therefore, the mode A which shows a high resistance state where little current flows regardless of an applied voltage corresponds to "the first state". The mode B and the mode C correspond to "the second state" and "the third state", respectively, or the mode B and the mode C correspond to "the third state" and "the second state" of the antifuse, respectively. In this embodiment mode, it is assumed that the mode B corresponds to "the second state", and that the mode C corresponds to "the third state". Accordingly, R1>R2>R3 is satisfied, where the applied voltage is less than or equal to the breakdown voltage; the electric resistance of the antifuse in "the first state" is R1; the electric resistance of the antifuse in "the second state" is R2; and the electric resistance of the antifuse in "the third state" is R3.

The antifuse where data has been written or the antifuse which is placed in a block where data has been written is in a state of either "the second state" or "the third state". Then, binary data are made to correspond to "the second state" and "the third state". The binary data "0" and "1" may be assigned by setting a threshold th between "the second state" and "the third state" to use the threshold th as a boundary therebetween.

Reading of the data can be designed by a practitioner, as appropriate, and a method using a current, a method using a voltage, or the like can be used. For example, as shown in FIG. 1, a threshold Ath is set between the mode C and the mode B at a predetermined reading voltage (Vread). In the case where a current value is greater than or equal to the threshold Ath, "1" of the binary data is assigned, and in the case where a current value is less than the threshold Ath, "0" of the binary data is assigned. By comparing a current value in applying a reading voltage with the threshold Ath, the binary data can be read. For example, when a current value of greater than or equal to the threshold Ath is obtained, reading of "1" can be performed, and when a current value of less than the threshold Ath is obtained, reading of "0" can be performed. Further, the binary data can be read by setting a threshold Vth based on the threshold Ath and by comparing the threshold Vth with an output voltage obtained by applying a reading voltage.

In this embodiment mode, the block where data has been written or the antifuse where data has been written is detected. In the block or the antifuse where data has been written, "the second state" representing the mode B is read as "0", and "the third state" representing the mode C is read as "1".

Note that "0" or "1" may be assigned to "the first state" representing the mode A in the block or the antifuse where data has not been written. That is, "0" or "1" of the binary data may be assigned to the initial state where a writing voltage is not applied, in the block or the antifuse where data has not been written. Alternatively, data other than "0" or "1" may be assigned to "the first state" so that the data may be separately read as "the first state".

Further, "the second state" and "the third state" are considered. "The second state" and "the third state" in this embodiment mode are writing states where data has been written into an antifuse in "the first state", which is the initial state, by applying a breakdown voltage to the antifuse. Note that "a breakdown voltage" in the present specification refers to a voltage at which the structure of the antifuse is changed and thus the state is changed from a high resistance state to a low resistance state. Further, "a breakdown voltage" is also referred to as a writing voltage (Vwrite). Data is written into the antifuse by applying a breakdown voltage to an insulating region of the antifuse. In "the third state", dielectric breakdown occurs in the insulating region of the antifuse to which the breakdown voltage is applied, so that the upper and lower electrodes of the antifuse are shorted; accordingly, the resistance of the antifuse is changed. That is, the state of the antifuse is changed by the dielectric breakdown which occurs in the antifuse.

As an example of "the third state" in this embodiment mode, the mode C shown in FIG. 1 is given. In general, in the antifuse, a low resistance state as shown by the mode C in which a current flows in proportion to an applied voltage is a state called a conductive state. Note that "the third state" is a state which is changed from "the first state" by application of a breakdown voltage to an antifuse in "the first state", and the change is irreversible. Further, "the third state" is a writing state where writing is performed by the short between the upper and lower electrodes of the antifuse. Therefore, even when a breakdown voltage is applied again to the antifuse in "the third state", writing can not be performed. Accordingly, the state of the antifuse in "the third state" can not be changed to any of the other states ("the first state" or "the second state").

As an example of "the second state" in this embodiment mode, the mode B shown in FIG. 1 is given. The mode B shows a high resistance state where little current flows at a voltage of lower than a predetermined applied voltage, and shows a low resistance state where a current flows more at a voltage of higher than or equal to a predetermined applied voltage. Note that "the second state" is a state which is changed from "the first state" by application of a breakdown voltage to an antifuse in "the first state", and the change to "the second state" is irreversible. Further, "the second state" is a writing state where writing is performed by changing a layer between the upper and lower electrodes of the antifuse. Therefore, even when a breakdown voltage is applied again to the antifuse in "the second state", writing can not be performed. Accordingly, the state of the antifuse in "the second state" can not be changed to any of the other states ("the first state" or "the third state").

The antifuse according to the present invention forms the memory. Here, in the memory, data is written in blocks and it is distinguished in blocks whether or not the data has been written. At the time of manufacturing the present antifuse, all the antifuses are in "the first state" which can be changed to "the second state" or "the third state". The state of the antifuse of which data is desired to be fixed to "0" by writing is changed to "the second state". The state of the antifuse of which data is desired to be fixed to "1" by writing is changed to "the third state". In a block where data has been written, all the antifuses are inevitably in either "the second state" or "the third state". "0" (or "1") of the binary data is made to correspond to "the second state", and "1" (or "0") of the binary data is made to correspond to "the third state", whereby data is formed. As described above, the state of the antifuse which is changed to "the second state" by writing can not be changed to any of the other states ("the first state" or "the third state"). Similarly, the state of the antifuse which is changed to "the third state" by writing can not be changed to any of the other states ("the first state" or "the second state"). Therefore, by applying the present antifuse, memory can be realized in which the binary data "0" and "1" can not be physically rewritten in a block where data has been written.

Note that, memory including the present antifuse may be ROM in which data is written into all the antifuses so that each of the antifuses is in "the second state" or "the third state", or may be write-once memory provided with an antifuse in "the first state", at the time of shipping the memory. By including the antifuse in "the first state", write-once read-many memory, into which additional writing can be performed as needed, can be realized.

In the memory using the present antifuse, the binary data "0" and "1" correspond to "the second state" and "the third state" in the block or the antifuse where data has been written, and it is impossible to cause a change from "the second state" to "the first state" or "the third state" and a change from "the third state" to "the first state" or "the second state". The memory using the present antifuse is provided with the antifuses each having an element structure in which the state of the antifuse in the initial state is changed to a state corresponding to the binary data "0" or "1". In addition, the memory using the present antifuse can make it impossible to physically rewrite the data. Therefore, in the memory including the present antifuse, data which has once been written can not be rewritten, and thus, falsification of data can be prevented. In addition, by using the antifuses having identical element structures, write-once read-many memory can be realized in which data can not be rewritten.

Note that this embodiment mode can be freely combined with any of the other embodiment modes and embodiments.
(Embodiment Mode 2)

In this embodiment mode, an example of an element structure of an antifuse which can be in either of two writing states, and examples of a writing method are described.

Figure 2A:
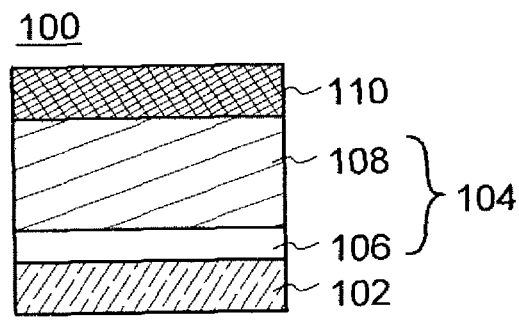
FIGS. 2A to 2C are cross-sectional views illustrating an example of an element structure of an antifuse according to an aspect of the present invention.

FIG. 2A is a schematic view of a cross section of an antifuse 100 (also referred to as an antifuse element 100 or a memory element 100). In this embodiment mode, the antifuse 100 has a structure in which an insulating layer 106, a silicon layer 108, and a second electrode 110 are stacked in this order over a first electrode 102. The insulating layer 106 and the silicon layer 108 collectively function as a resistance material layer 104.

The antifuse 100 is in one state selected from "a first state", "a second state", or "a third state". One of the three states is an initial state where data has not been written, and the other two are writing states. The two writing states can be obtained by writing data into the antifuses having identical element structures. Writing data into the antifuse is performed by applying a breakdown voltage between the first electrode 102 and the second electrode 110 to change part of or the entire of a portion between these electrodes. Specifically, "the first state", "the second state", and "the third state" are different from each other in an electric resistance. In this embodiment mode, an initial state is referred to as "the first state" and two writing states are referred to as "the second state" and "the third state". In the present invention, memory includes a plurality of antifuses, and data is written in blocks (or in antifuses) into the antifuses included in the memory. Further, it is distinguished in blocks (or in antifuses) whether or not data has been written. One feature of the present invention is that an antifuse which is placed in a block where data has been written is inevitably in "the second state" or "the third state" as a writing state, and that "the second state" and "the third state" are made to correspond to binary data "0" and "1". That is, in a block where data has been written, "the first state" which is the initial state is not present.

Note that an I-V characteristic of the "first state" in this embodiment mode shows the behavior of a mode A shown in FIG. 1; an I-V characteristic of the "second state", a mode B; and an I-V characteristic of the "third state", a mode C.

The state of the present antifuse 100 where data has not been written, that is, "the first state", is a non-conductive state. Therefore, the antifuse 100 in the state has a high electric resistance. In the antifuse 100 like this, the first electrode 102 or the second electrode 110 is made to function as an anode or a cathode, and a predetermined voltage (a breakdown voltage) is applied between the first and second electrodes 102 and 110, whereby the silicon layer which forms the resistance material layer and the electrode in contact with the silicon layer are reacted each other. Here, a silicide reaction occurs since the silicon layer is formed. A region where a silicide reaction occurs is provided in the resistance material layer, and thus, the resistance of the resistance material layer is partly or entirely reduced. Accordingly, the electric resistance of the antifuse 100 is changed before and after application of a breakdown voltage.

Figure 2B:
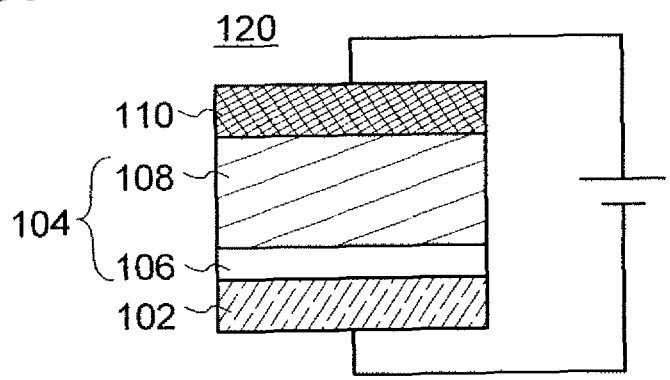
Figure 2C:
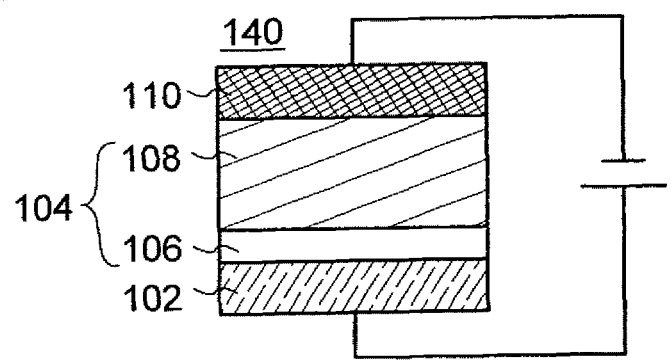

In this embodiment mode, the change in an electric resistance of the antifuse differs depending on a direction in which a voltage is applied between the electrodes. For example, by making the second electrode 110 which is in contact with the silicon layer 108 function as an anode as shown in FIG. 2B, the state of the antifuse is changed to "the second state", which shows the behavior of a mode B in which the state of the antifuse is changed to a high resistance state at a voltage of lower than a predetermined voltage and in which the state of the antifuse is changed to a low resistance state at a voltage of higher than or equal to the predetermined voltage, in the case of applying a breakdown voltage into a first direction. In contrast, by making the second electrode 110 which is in contact with the silicon layer 108 function as a cathode as shown in FIG. 2C, the state of the antifuse is changed to "the third state", which shows the behavior of a mode C in which the state of the antifuse is changed to a low resistance state, in the case of applying a breakdown voltage in a second direction which is a direction opposite to the first direction. In such a manner, the direction in which a voltage is applied between electrodes is controlled so that the first direction or the second direction which is a direction opposite to the first direction is selected, whereby "the second state" and "the third state" are obtained. That is, in the case shown in FIG. 2B, a voltage is applied so that the second electrode 110 has a potential higher than the first electrode 102, whereby the state of the antifuse is changed to "the second state" representing the mode B. On the other hand, in the case shown in FIG. 2C, a voltage is applied so that the second electrode 110 has a potential lower than the first electrode 102, whereby the state of the antifuse is changed to "the third state" representing the mode C. When a voltage is applied between the first electrode 102 and the second electrode 110, by selecting from making the second electrode 110 have a potential higher than the first electrode 102 or making the second electrode 110 have a potential lower than the first electrode 102, "the second state" or "the third state" is obtained. Then, the thus obtained "second state" and "third state" are made to correspond to binary data "0" and "1".

Note that, in the antifuse 100 where data has been written, part of or the entire of the resistance material layer is changed, and the first electrode 102 and the second electrode 110 are in a conductive state. In this embodiment mode, a silicide reaction occurs in the silicon layer and the second electrode, and thus, a silicide region is formed in part of or the entire of the resistance material layer. A voltage at which a silicide reaction occurs differs depending on a direction in which a voltage is applied. Therefore, it is considered that, in the case of applying breakdown voltages, different reactions occur depending on a direction in which a voltage is applied.

Next, a method for manufacturing the antifuse 100 is described.

First, the first electrode 102 is formed. The first electrode 102 is formed using a substance such as tungsten, titanium, aluminum, nickel, chromium, molybdenum, tantalum, cobalt, zirconium, vanadium, palladium, hafnium, platinum, or iron, or an alloy or a compound which includes one or a plurality of these materials. After forming a conductive layer using the above-described material by an evaporation method, a sputtering method, a printing method, a plating method, or the like, the conductive layer is selectively etched, whereby the conductive layer can be processed into a desired shape.

Next, the resistance material layer 104 is formed over the first electrode 102. The resistance material layer 104 may be formed using a layer the state of which can be changed from a high resistance state to a low resistance state by an electric signal. In this embodiment mode, the insulating layer 106 is formed over the first electrode 102, and the silicon layer 108 is formed over the insulating layer 106.

The insulating layer 106 is formed using silicon oxide, silicon nitride, silicon oxynitride, silicon nitride oxide, or the like by a CVD method, a sputtering method, an ALD method, or the like. Alternatively, the insulating layer 106 can be formed by subjecting the first electrode 102 to surface treatment. As the surface treatment, oxidation treatment, nitridation treatment, oxynitridation treatment, of the like can be used. The thickness of the insulating layer 106 may be approximately 1 nm to 20 nm, preferably 1 nm to 15 nm.

The silicon layer 108 is formed using a material containing silicon as its main component by a CVD method, a sputtering method, or the like. A crystal structure of the silicon layer 108 may be any of amorphous silicon, microcrystalline silicon, and polycrystalline silicon, and a plurality of crystal structures may be mixed in the silicon layer 108. The thickness of the silicon layer 108 may be approximately 1 nm to 200 nm, preferably 5 nm to 100 nm.

Note that in the case of using amorphous silicon for the silicon layer 108, amorphous silicon containing hydrogen (hereinafter, referred to as "hydrogenated amorphous silicon") can be used. The hydrogenated amorphous silicon here means amorphous silicon containing hydrogen at approximately greater than or equal to 2 atomic %, preferably at approximately greater than or equal to 2 atomic % and less than or equal to 20 atomic %. It is considered that, by using hydrogenated amorphous silicon for the resistance material layer, a short between the electrodes which is caused by a silicide reaction can easily occur. In such hydrogenated amorphous silicon, hydrogen can be contained at the time of film formation, or can be contained by adding hydrogen in a separate step after film formation. For example, film formation is performed in a gas containing hydrogen by a plasma CVD method, whereby hydrogenated amorphous silicon can be formed. At this time, the amount of hydrogen contained in hydrogenated amorphous silicon can be adjusted by setting film formation conditions (gas composition, gas pressure, gas atmosphere, gas flow rate, a temperature of a chamber, a substrate temperature, applied power, or the like), as appropriate. Alternatively, hydrogen can be contained by adding hydrogen by an ion implantation method or an ion doping method after forming amorphous silicon which does not contain much hydrogen by an LPCVD method or the like. Note that in the case where hydrogenated amorphous silicon is formed by containing hydrogen at the time of film formation, it is preferable that hydrogenated amorphous silicon be formed in a low-temperature process, specifically, at a temperature of lower than or equal to 350° C. Further, a process temperature after forming hydrogenated amorphous silicon is preferably lower than or equal to 350° C. in order to prevent dehydrogenation.

Next, the second electrode 110 is formed over the resistance material layer 104. The second electrode 110 may be formed using a material and a method which are similar to that of the first electrode 102. Specifically, the second electrode 110 may be formed using a substance such as tungsten, titanium, aluminum, nickel, chromium, molybdenum, tantalum, cobalt, zirconium, vanadium, palladium, hafnium, platinum, or iron, or an alloy or a compound which includes one or a plurality of these materials. A method for manufacturing the second electrode 110 may be as follows: a conductive layer is formed by an evaporation method, a sputtering method, a printing method, a plating method, or the like, and then, the conductive layer is selectively etched, whereby the conductive layer is processed into a desired shape. Further, the second electrode 110 may be formed using the same material as the first electrode 102 or may be formed using a different material from the first electrode 102.

Through the above-described steps, the antifuse 100 described in this embodiment mode can be obtained. In the present antifuses 100, the two writing states can be produced by applying breakdown voltages in opposite directions between electrodes. The two writing states can be obtained by applying voltages in opposite directions to antifuses having identical element structures. The two writing states are different in an electric resistance, and one of the two writing states can not be changed to the other of the two writing states, the initial state, or the like. Therefore, by writing data such that the two writing states are assigned to the binary data "0" and "1" and thus obtaining a block where the data has been written, it can make it impossible to physically rewrite data in the block. Further, by including the block where data has not been written which is provided with the antifuse in "the first state", write-once memory can be obtained. Accordingly, write-once memory which prevents falsification of data can be realized.

Note that this embodiment mode can be freely combined with any of the other embodiment modes and embodiments.
(Embodiment Mode 3)

In this embodiment mode, an example of an element structure of an antifuse which is different from that in Embodiment Mode 2 is described.

Figure 3A:
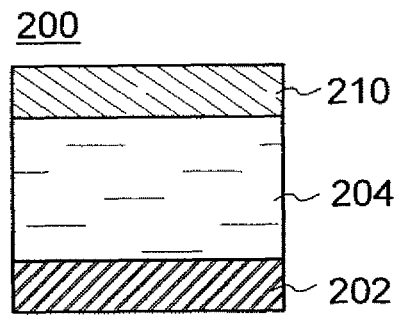
FIGS. 3A to 3C are cross-sectional views illustrating examples of an element structure of an antifuse according to an aspect of the present invention.

FIG. 3A is a schematic view of a cross section of an antifuse 200 (also referred to as an antifuse element 200 or a memory element 200). The present antifuse 200 has a structure in which a resistance material layer 204 and a second electrode 210 are stacked in this order, where the resistance material layer 204 is formed over a first electrode 202 and the second electrode 210 made of a material different from the first electrode 202 is formed over the resistance material layer 204. Writing data into the present antifuse 200 is performed by applying a breakdown voltage between the first electrode 202 and the second electrode 210 to change part of or the entire of a portion between these electrodes.

The present antifuse 200 has a similar characteristic to the antifuse 100 of Embodiment Mode 2. That is, the present antifuse 200 is in one state selected from "a first state", "a second state", or "a third state" which are different from each other in an electric resistance. An I-V characteristic of "the first state" shows the behavior of the mode A shown in FIG. 1, an I-V characteristic of "the second state" shows the behavior of the mode B shown in FIG. 1, and an I-V characteristic of "the third state" shows the behavior of the mode C shown in FIG. 1. Thus, the order of electric resistances of "the first state", "the second state", and "the third state" from highest to lowest, is the electric resistance of "the first state", the electric resistance of "the second state", and the electric resistance of "the third state"; that is, "the first state"≥"the second state"≥"the third state" is satisfied. Specifically, "the first state" is an initial state, and "the second state" and "the third state" are writing states. Each of "the second state" and "the third state" are produced from the antifuse in the "first state". Memory according to the present invention can include a plurality of antifuses 200. Further, data is written in blocks (or in antifuses) into antifuses included in the memory, and it is distinguished in blocks (or antifuses) whether or not data has been written. An antifuse which is placed in a block where data has been written is inevitably in either "the second state" or "the third state" each of which is the writing state, and "the second state" and "the third state" are made to correspond to binary data "0" and "1".

According to the present antifuse 200, by using different materials for the first electrode 202 and the second electrode 210 that are a pair of electrodes, and by controlling a direction in which a voltage is applied between the first electrode 202 and the second electrode 210, antifuses with different electric resistances can be obtained. This is because an energy barrier at the interface between the first electrode 202 and the resistance material layer 204 is different from an energy barrier at the interface between the second electrode 210 and the resistance material layer 204 by using different materials for the first electrode 202 and the second electrode 210. That is, by using different materials for the first electrode 202 and the second electrode 210, ease of current flow in antifuses can differ. Therefore, it is considered that, even when breakdown voltages are applied, ease of current flow of antifuses differ according to a direction in which a voltage is applied, namely, a first direction or a second direction opposite to the first direction, and that, as the result of this, changes in resistance of the resistance material layers 204 are different.

For example, in the antifuse shown in FIG. 3A, a tungsten layer is formed as the first electrode 202 and a titanium layer is formed as the second electrode 210. An amorphous silicon layer is formed as the resistance material layer 204. The antifuse shown in FIG. 3A is in a state where a voltage has not been applied, and the antifuse is in "the first state".

Figure 3B:
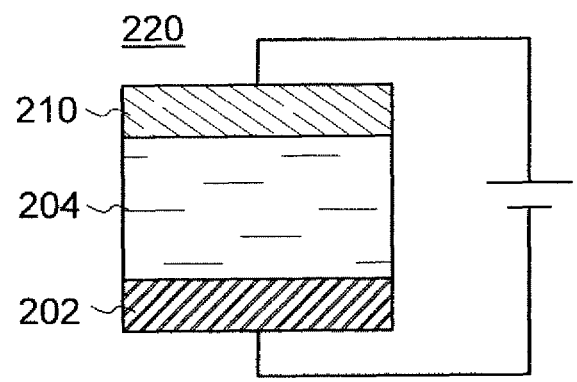
Figure 3C:
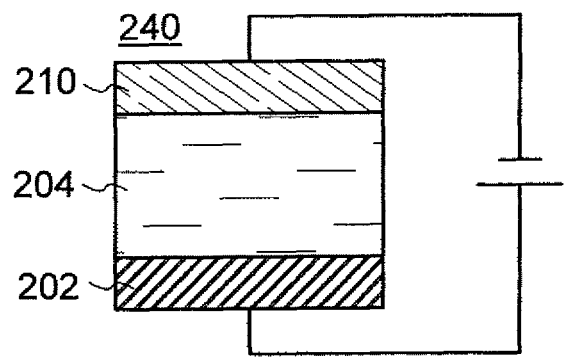

As shown in FIG. 3B, the first electrode 202 formed of the tungsten layer is made to function as a cathode, and the second electrode 210 formed of the titanium layer is made to function as an anode; in such a condition, a voltage is applied in a first direction. Since tungsten has a work function higher than titanium, an energy barrier at the interface between the first electrode 202 and an amorphous silicon layer as the resistance material layer 204 is higher than an energy barrier at the interface between the second electrode 210 and the amorphous silicon layer which is the resistance material layer 204. Therefore, electrons are not easily introduced from the first electrode 202 into the amorphous silicon layer which is the resistance material layer 204. On the other hand, as shown in FIG. 3C, the first electrode 202 formed of the tungsten layer is made to function as an anode, and the second electrode 210 formed of the titanium layer is made to function as a cathode; in such a condition, a voltage is applied in a second direction opposite to the first direction. Since titanium has a work function lower than tungsten, an energy barrier at the interface between the second electrode 210 and the amorphous silicon layer which is the resistance material layer 204 is lower than an energy barrier at the interface between the first electrode 202 and the amorphous silicon layer which is the resistance material layer 204. Therefore, electrons are easily introduced from the second electrode 210 into the amorphous silicon layer which is the resistance material layer 204. Accordingly, ease of current flow in antifuses differ by control of a direction in which a voltage is applied. Thus, it is considered that, even when breakdown voltages are applied, different reactions occur in the amorphous silicon layers which are the resistance material layers 204, depending on a direction in which a voltage is applied.

As described above, it is considered that electrons are not easily introduced in the case of applying a voltage in a manner shown in FIG. 3B as compared to the case of applying voltage in a manner shown in FIG. 3C, and consequently, it is considered that a current does not easily flow in the case of applying a voltage in a manner shown in FIG. 3B. That is, it is considered that a signal voltage applied to the resistance material layer in the case shown in FIG. 3B is smaller than a signal voltage in the case shown in FIG. 3C. Therefore, the state is changed to "the second state" in the case of applying a voltage in a manner shown in FIG. 3B, and the state is changed to "the third state" in the case of applying a voltage in a manner shown in FIG. 3C.

Through the above-described steps, two writing states can be produced in the present antifuses 200 by using different materials for the first electrode and the second electrode which form a pair of electrodes and by applying breakdown voltages in opposite directions in applying a breakdown voltage between the electrodes. The two writing states can be obtained by applying voltages in opposite directions to antifuses having identical element structures. The two writing states are different from each other in an electric resistance, and one of the two writing states can not be changed to any of the other states such as the other of the two writing states or the initial state. Therefore, by writing data such that the two writing states are assigned to the binary data "0" and "1", it can make it impossible to physically rewrite data into a block where data has been written. Further, by including the block where data has not been written which is provided with the antifuse in "the first state", write-once memory can be obtained. Accordingly, write-once memory which prevents falsification of data can be realized.

Note that this embodiment mode can be freely combined with any of the other embodiment modes and embodiments.
(Embodiment Mode 4)

In this embodiment mode, a step for manufacturing a semiconductor device provided with antifuse type memory according to the present invention is described with reference to FIGS. 4A and 4B. Here, an example is described in which a semiconductor device which performs communication by radio is manufactured.

Specifically, an example of manufacturing a radio chip including an antenna portion 394 for receiving or transmitting a radio signal; a memory portion 392 where data is written; and a driver circuit portion 390 in which various kinds of circuits such as a circuit for writing data into the memory portion 392, a circuit for reading data written into the memory portion 392, a circuit for analyzing a signal received by the antenna portion 394, or a circuit for producing power from a received signal are integrated is described. Elements such as a thin film transistor included in the driver circuit portion 390 and an antifuse included in the memory portion 392, and an antenna included in the antenna portion 394 are sealed with a substrate or a sheet which is formed using a flexible material. Further, radio chips as an example of the present semiconductor devices may be separately manufactured over separate substrates, or may be obtained by division into individual chips as appropriate after a plurality of radio chips is manufactured at one time using a large-area substrate. Note that a cross-sectional structure shown in FIG. 4A is a process diagram in the middle of manufacturing the present semiconductor device. Further, FIGS. 4A and 4B illustrate cross-sectional views each including two thin film transistors in the driver circuit portion 390 for convenience, though circuits using thin film transistors are integrated in the driver circuit portion 390. Similarly, FIGS. 4A and 4B illustrate cross-sectional views each including one antifuse in the memory portion 392 for convenience, though memory includes a plurality of antifuses in the memory portion 392.

First, a separation layer 304 and an insulating layer 306 are stacked in this order over a substrate 302. As the substrate 302, a substrate having an insulating surface such as a quartz substrate, a glass substrate, or the like is used. As the separation layer 304, a tungsten layer with a thickness of 50 nm to 200 nm is formed. As the insulating layer 306, a silicon oxide layer is formed. Note that as the separation layer 304, a metal layer such as a molybdenum layer or a titanium layer as well as the tungsten layer given above; a stacked-layer structure of the metal layer, and a metal oxide (for example, tungsten oxide) layer of any of these or a metal nitride (for example, tungsten nitride) layer of any of these; an amorphous silicon layer; or the like can be used. As the insulating layer 306, a silicon nitride layer, a silicon oxynitride layer, or a silicon nitride oxide layer as well as the silicon oxide layer, or a stacked film of these layers can be used. In the case where a metal layer such as a tungsten layer is formed as the separation layer 304 and an oxide layer such as a silicon oxide layer or a silicon oxynitride layer is formed as the insulating layer 306, a layer including a metal oxide of metal used in the separation layer may be formed between the metal layer and the oxide layer. Similarly, in the case where a nitride layer such as a silicon nitride layer or a silicon nitride oxide layer is formed as the insulating layer 306, a layer including a metal nitride of metal used in the separation layer may be formed between the metal layer and the nitride layer.

Then, a semiconductor layer 305 and a semiconductor layer 307 are formed over the insulating layer 306. An amorphous silicon layer formed over an entire surface by a CVD method or a sputtering method is crystallized to obtain a polysilicon layer, then the polysilicon layer is selectively etched, whereby the semiconductor layer 305 and the semiconductor layer 307 can be formed. As a method for crystallizing the amorphous silicon layer, a laser crystallization method, a thermal crystallization method using rapid thermal annealing (RTA) or an annealing furnace; a crystallization method using a metal element that promotes crystallization; a method combining these methods; or the like can be used. Note that as the semiconductor layer 305 and the semiconductor layer 307, microcrystalline silicon or single crystal silicon may be used. Further, in order to control a threshold voltage of a thin film transistor to be completed later, a small amount of impurity elements (impurity elements imparting either n-type conductivity or p-type conductivity) may be added to the semiconductor layer 305 and the semiconductor layer 307. Note that the semiconductor layer 305 and the semiconductor layer 307 form channel formation regions of thin film transistors to be formed later. In order to realize high-speed driving of a driver circuit, a semiconductor layer having a crystal structure is preferably used for the semiconductor layer which forms a channel formation region of a thin film transistor. By realizing high-speed driving of the driver circuit, data in memory can be read at high speed.

Then, a gate insulating layer 308 is formed over the semiconductor layer 305 and the semiconductor layer 307. As the gate insulating layer 308, a silicon oxide layer or a silicon oxynitride layer with a thickness of 1 nm to 200 nm is formed by a CVD method or a sputtering method. Alternatively, the gate insulating layer 308 can be formed by subjecting the semiconductor layer 305 and the semiconductor layer 307 to surface oxidation treatment or surface nitridation treatment which uses plasma excited by a microwave. Further alternatively, the gate insulating layer 308 can be formed by forming an insulating layer over the semiconductor layer 305 and the semiconductor layer 307, then subjecting the insulating layer to surface oxidation treatment or surface nitridation treatment.

Then, a gate electrode 310 which overlaps with the semiconductor layer 305 and a gate electrode 312 which overlaps with the semiconductor layer 307 are formed with the gate insulating layer 308 interposed between the gate electrode 310 and the semiconductor layer 305 and between the gate electrode 312 and the semiconductor layer 307. Further, a first electrode 314 which functions as one of the electrodes of the antifuse is formed in the same step as the gate electrode 310 and the gate electrode 312. The gate electrode 310, the gate electrode 312, and the first electrode 314 are formed using a substance such as tungsten, titanium, aluminum, nickel, chromium, molybdenum, tantalum, cobalt, zirconium, vanadium, palladium, hafnium, platinum, or iron, or an alloy or a compound of any of these. Specifically, the gate electrode 310, the gate electrode 312, and the first electrode 314 may be formed by forming a conductive layer using the above-described material by a sputtering method, then processing the conductive layer into a desired shape. Here, a material is selected which has both a characteristic suitable for the gate electrode of the thin film transistor and a characteristic suitable for the electrode of the antifuse. In this embodiment mode, a tungsten layer is formed as the gate electrode 310, the gate electrode 312, and the first electrode 314.

Then, an impurity element is added to the semiconductor layer 305 and the semiconductor layer 307. Here, impurity elements imparting different conductivity types are added to the semiconductor layer 305 and the semiconductor layer 307. Specifically, an impurity element imparting n-type conductivity is added to the semiconductor layer 305, and an impurity element imparting p-type conductivity is added to the semiconductor layer 307. For the impurity element imparting n-type conductivity, phosphorus (P), arsenic (As), or the like is used. For the impurity element imparting p-type conductivity, boron (B), aluminum (Al), gallium (Ga), or the like is used. Further, the impurity element may be added by an ion implantation method or an ion doping method.

A first resist mask which covers the semiconductor layer 307 is formed, and an impurity element imparting n-type conductivity is added to the semiconductor layer 305 with the first resist mask and the gate electrode 310 used as masks. In the semiconductor layer 305, a channel formation region 316 and a pair of n-type impurity regions 318 are formed in a self-aligned manner with the gate electrode 310 used as a mask. The n-type impurity regions 318 each function as a source region or a drain region.

Then, the first resist mask which covers the semiconductor layer 307 is removed. After a second resist mask which covers the semiconductor layer 305 is formed, an impurity element imparting p-type conductivity is added to the semiconductor layer 307 with the second resist mask and the gate electrode 312 used as masks. In the semiconductor layer 307, a channel formation region 320 and a pair of p-type impurity regions 322 are formed in a self-aligned manner with the gate electrode 312 used as a mask. The p-type impurity regions 322 each serve as a source region or a drain region. Then, the second resist mask which covers the semiconductor layer 305 is removed. Note that although an example is described in which an impurity element imparting n-type conductivity is added in advance, there is no particular limitation on the addition order of impurity elements.

Further, a low-concentration impurity region which functions as an LDD region may be formed in the semiconductor layer 305 and the semiconductor layer 307. The low-concentration impurity region is formed between the channel formation region and the impurity region that functions as a source region or a drain region. For example, before an impurity element is added to the semiconductor layer, a sidewall insulating layer is formed on a side surface of the gate electrode. The sidewall insulating layer is used as a mask in adding an impurity element, whereby a low-concentration impurity region can be formed to be adjacent to the channel formation region. Of course, a low-concentration impurity region can be formed by utilizing a resist mask which is newly formed for formation of a low-concentration impurity region. By providing an LDD region, an electric field near a drain region can be alleviated, whereby deterioration due to hot carrier injection can be prevented.

Then, activation of the impurity elements added to the semiconductor layer 305 and the semiconductor layer 307, or hydrogenation of the semiconductor layer is performed. The activation of the impurity elements and the hydrogenation of the semiconductor layer are performed by irradiation with a laser beam, thermal treatment using an annealing furnace or RTA, or the like. Therefore, the gate electrode 310, the gate electrode 312, and the first electrode 314 are formed of a material which can withstand a treatment temperature for the activation of the impurity elements and the hydrogenation of the semiconductor layer. Note that in this embodiment mode, the gate electrode 310, the gate electrode 312, and the first electrode 314 are formed using a tungsten layer. Tungsten is high-melting-point metal, and thus, tungsten can fully withstand a treatment temperature for the activation and the hydrogenation.

Next, an interlayer insulating layer 324 which covers the gate electrode 310, the gate electrode 312, and the first electrode 314 is formed. The interlayer insulating layer 324 is formed using an inorganic insulating material such as silicon oxide, silicon nitride, silicon oxynitride, or silicon nitride oxide by a sputtering method, a CVD method, or the like. Note that the interlayer insulating layer 324 may have a single layer structure or a stacked-layer structure. Further, the interlayer insulating layer 324 also functions as a partition which insulates adjacent antifuses.

Alternatively, the interlayer insulating layer 324 can be formed using a siloxane resin which can be formed by a coating method and which has high heat resistance. Note that the siloxane resin corresponds to resin including a Si—O—Si bond. Siloxane is composed of a skeleton formed by the bond of silicon (Si) and oxygen (O), in which an organic group (such as an alkyl group and an aryl group) or a fluoro group may be used as a substituent. A fluoro group may be included in the organic group.

Next, the interlayer insulating layer 324 and the gate insulating layer 308 are selectively etched to form openings. In the etching, a position where an opening will not be formed may be covered with a resist mask. Further, the etching may be performed by a dry etching method or a wet etching method, or may be performed by combining these etching methods. After the etching, the resist mask which is no longer needed is removed. Here, openings reaching the impurity region 318 formed in the semiconductor layer 305, openings reaching the impurity region 322 formed in the semiconductor layer 307, and openings reaching the first electrode 314 are formed. As the openings reaching the first electrode 314, a first opening where a resistance material layer and a second electrode of the antifuse are to be formed later and a second opening where a wiring which is electrically connected to the first electrode 314 is to be formed are formed. Further, although not shown, openings reaching the gate electrode 310 and the gate electrode 312 are formed. The first opening reaching the first electrode 314, which is formed in this etching step, has a diameter of its bottom surface of about 1 µm to 6 µm. However, the first opening is preferably small because consumption current is increased as the diameter of the first opening is larger. Note that although the size of the opening is indicated by a diameter, the shape of a top surface of the opening is not limited to round, and ellipse or rectangle may also be employed.

The openings reaching the semiconductor layers, the openings reaching the gate electrodes, and the openings reaching the first electrode can be formed in one-time etching by controlling an etching condition as appropriate.

The resistance material layer is formed to cover the first opening reaching the first electrode 314. Here, as the resistance material layer, a stacked-layer structure of a silicon oxynitride layer 326 and an amorphous silicon layer 328 is formed. The silicon oxynitride layer 326 is formed to a thickness of 1 nm to 20 nm, preferably 1 nm to 15 nm, by a CVD method or a sputtering method. The amorphous silicon layer 328 is formed to a thickness of 1 nm to 200 nm, preferably 5 nm to 100 nm, by a CVD method or a sputtering method. Note that as the resistance material layer, a layer the state of which is changed from a high resistance state to a low resistance state by application of an electric signal is formed.

Next, after a conductive layer is formed over an entire surface of the substrate by a sputtering method, the conductive layer is selectively etched to form a conductive layer 330, a conductive layer 332, and a conductive layer 334. Further, a second electrode 338 functioning as the other of the electrodes of the antifuse formed in the memory portion 392, a third electrode 336, and a connection electrode 340 of the antenna portion 394, are formed in the same step as the conductive layer 330, the conductive layer 332, and the conductive layer 334. The conductive layers 330, 332, and 334 function as source electrodes and drain electrodes of thin film transistors formed in the driver circuit portion 390. Note that the conductive layer 332 also functions as a wiring which electrically connects the semiconductor layer 305 and the semiconductor layer 307. The connection electrode 340 formed in the antenna portion 394 is an electrode which electrically connects an antenna and a power supply formation circuit to be formed later.

The conductive layer which forms the conductive layers 330, 332, and 334, the third electrode 336, the second electrode 338, and the connection electrode 340 may be formed from a material selected from the above-described materials for the gate electrodes, as appropriate. Here, a three-layer structure is formed in which a titanium layer with a thickness of 50 nm to 200 nm, an aluminum layer with a thickness of 100 nm to 400 nm, and a titanium layer with a thickness of 50 nm to 200 nm are stacked. The titanium layer which forms the second electrode 338 is in contact with the amorphous silicon layer 328 which forms the resistance material layer.

The third electrode 336 formed in the memory portion 392 is electrically connected to the first electrode 314 and a wiring is led, whereby consuming power is reduced. In the case of active-type memory, the third electrode 336 functions to electrically connect the first electrode 314 and a switching element which controls the antifuse (for example, a thin film transistor). In the case of passive-type memory, the first electrodes 314 may be arranged in parallel in a stripe form (strip form) and the second electrodes 338 may be arranged in parallel in a stripe form so as to be perpendicular to the first electrodes 314. In the case of passive-type memory, the third electrode 336 is made to function as a lead out electrode by being provided in an end portion of the first electrode 314.

In this embodiment mode, an example is described in which the conductive layers 330, 332, and 334, the third electrode 336, the second electrode 338, and the connection electrode 340 are each formed using a stacked structure of a titanium layer and an aluminum layer. By using a titanium layer for the conductive layer forming the conductive layers 330, 332, and 334, the third electrode 336, the second electrode 338, and the connection electrode 340, a contact resistance with other conductive materials can be low. Further, by using an aluminum layer for the conductive layer forming the conductive layers 330, 332, and 334, the third electrode 336, the second electrode 338, and the connection electrode 340, a wiring resistance can be low. Since the conductive layers 330, 332, and 334, the third electrode 336, the second electrode 338, and the connection electrode 340 are used as a lead out wiring of a driver circuit portion, a lead out wiring of a memory portion, and a connection portion of an antenna portion, it is useful to use the stacked structure of a titanium layer and an aluminum layer which can reduce a contact resistance and a wiring resistance.

Through the above-described steps, an n-channel transistor 331 and a p-channel transistor 333 are formed in the driver circuit portion 390. The n-channel transistor 331 and the p-channel transistor 333 which are formed in the driver circuit portion 390 are electrically connected to each other via the conductive layer 332, and the n-channel transistor 331 and the p-channel transistor 333 form a CMOS circuit. Note that in the driver circuit portion 390, a resistor, a capacitor, or the like may be concurrently manufactured as well as the thin film transistors.

In the memory portion 392, an antifuse 339 is formed. In the antifuse 339, a stacked-layer structure of the silicon oxynitride layer 326 and the amorphous silicon layer 328 is interposed as the resistance material layer between a pair of electrodes including the first electrode 314 and the second electrode 338, which are formed in the same step as the gate electrode 310 and the gate electrode 312 of the thin film transistors and in the same step as the conductive layers 330, 332, and 334 which function as source electrodes and drain electrodes of the thin film transistors.

Then, an insulating layer 342 is formed to cover the conductive layers 330, 332, and 334, the third electrode 336, the second electrode 338, and the connection electrode 340. The insulating layer 342 may be formed to have a single layer or a stack by using an inorganic insulating material or an organic insulating material, or by combining these materials.

Then, the insulating layer 342 is selectively etched to form openings. In the etching, a position where an opening is not formed may be covered with a resist mask. The etching may be performed by a dry etching method or a wet etching method, of may be performed by combining these etching methods. After the etching, the resist mask which is no longer needed is removed. Here, an opening reaching the third electrode 336 which is electrically connected to the first electrode 314 formed in the memory portion 392, and an opening reaching the connection electrode 340 formed in the antenna portion 394, are formed. Note that in order to ensure electrical connection with the antenna to be formed later, the diameter of the opening reaching the connection electrode 340 is made comparatively large or a plurality of openings reaching the connection electrode 340 is provided. After the etching, the resist mask which is no longer needed is removed.

Then, a conductive layer 346 is formed to cover the opening reaching the connection electrode 340. By forming the conductive layer 346, the adherence between the antenna to be formed later and the connection electrode 340 can be improved. Further, a conductive layer 344 is formed to cover the opening reaching the third electrode 336. The conductive layer 346 and the conductive layer 344 can be formed in the same step, and can be formed using titanium, copper, aluminum, or the like, for example. The conductive layer 346 and the conductive layer 344 can be selectively formed in a desired position by an ink-jet method or the like, or may be formed by forming a conductive layer over an entire surface of the substrate by a sputtering method, then selectively etching the conductive layer to be processed into a desired shape.

Then, an antenna 348 is formed over the conductive layer 346 formed in the antenna portion 394. A structure from the insulating layer 306 to the antenna 348 that are formed up to here is referred to as an element layer 360.

The antenna 348 can be formed by a sputtering method, or a printing method such as a screen printing method or an ink-jet method. In the case of forming the antenna 348 by a printing method, a conductive paste where conductive particles each having a grain size of several nanometers to several tens of nanometers are dispersed in an organic resin is selectively printed, then baking for reducing an electric resistance is performed, so that the antenna 348 is formed.

As the conductive particles, particles or dispersing nanoparticles of one or more metals selected from silver, gold, copper, nickel, platinum, palladium, tantalum, molybdenum, or titanium, or silver halide can be used. In addition, the organic resin included in the conductive paste can be one or more selected from organic resins which function as a binder, a solvent, a dispersing agent, and a coating material. Typically, an organic resin such as an epoxy resin or a silicone resin can be used. When forming the antenna 348, baking is preferably performed after the conductive paste is squeezed. For example, in the case of using a particle which includes silver as its main component (e.g., a particle size is greater than or equal to 1 nm and less than or equal to 100 nm) as a material for the conductive paste, a conductive layer functioning as the antenna 348 can be obtained by baking it at temperatures in the range of 150° C. to 300° C. to cure. Alternatively, a particle which includes solder or lead-free solder as its main component may be used as a conductive particle. In this case, it is preferable that a particle having a particle size of 20 μm or less be used. Solder and lead-free solder have an advantage such as low cost.

There is no particular limitation on the shape of the antenna 348. As a transmission method of a signal applied to the antenna 348, an electromagnetic coupling method, an electromagnetic induction method, a microwave method, or the like can be employed. The transmission method may be selected by a practitioner as appropriate in consideration of a use, and an antenna having an optimal length and shape may be provided depending on the transmission method.

In the case of employing, for example, an electromagnetic coupling method or an electromagnetic induction method (e.g., a 13.56 MHz band) as the transmission method, electromagnetic induction caused by a change in electric field density is used. Therefore, a conductive layer functioning as an antenna is formed in an annular shape (e.g., a loop antenna) or a spiral shape (e.g., a spiral antenna).

In the case where a micro-wave system (for example, UHF band (860 MHz to 960 MHz band), 2.45 GHz band, or the like) is applied as the transmission system, a length or a shape of the conductive layer functioning as an antenna may be selected as appropriate in consideration of a wavelength of a radio wave used for signal transmission. For example, the antenna 348 can be formed into a linear shape (e.g., a dipole antenna), a flat shape (e.g., a patch antenna), or the like. The shape of the conductive layer functioning as an antenna is not limited to the form of a line; the conductive layer functioning as an antenna may also be provided in the form of a curve, a meander, or a combination of them, considering the wavelength of the electromagnetic wave.

Figure 5A:
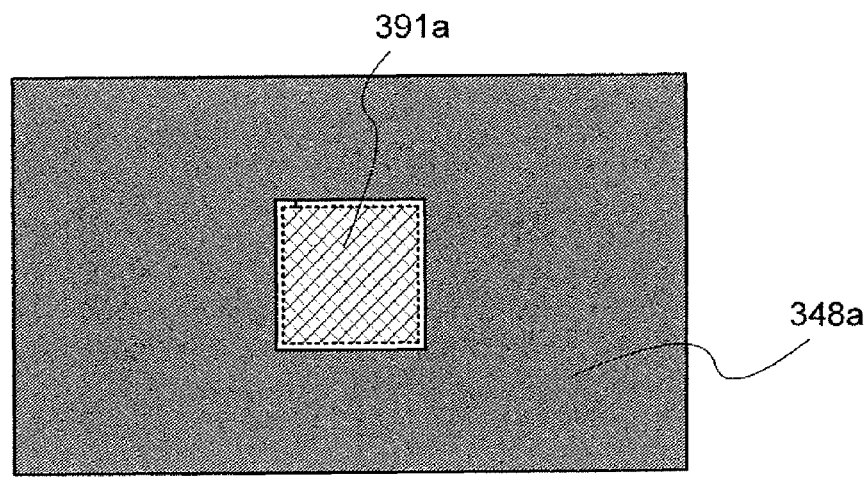
FIGS. 5A to 5E are diagrams illustrating antennas which are applicable to a semiconductor device according to an aspect of the present invention.
Figure 5B:
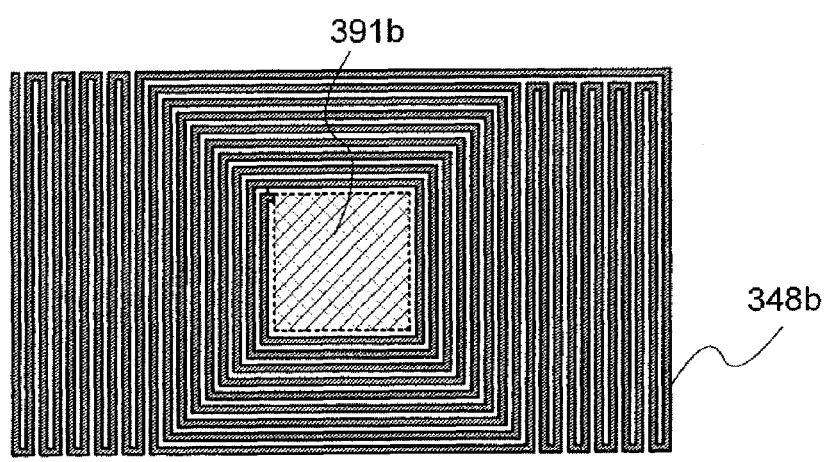
Figure 5C:
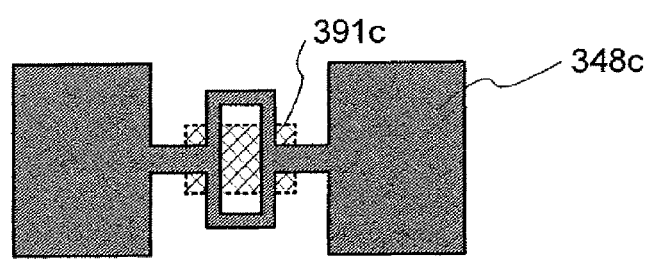
Figure 5D:
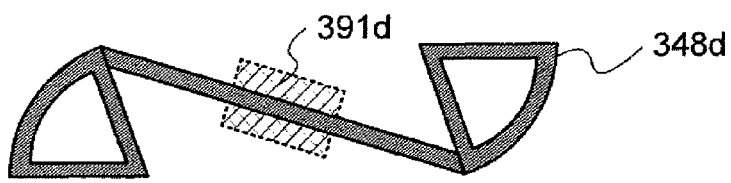
Figure 5E:
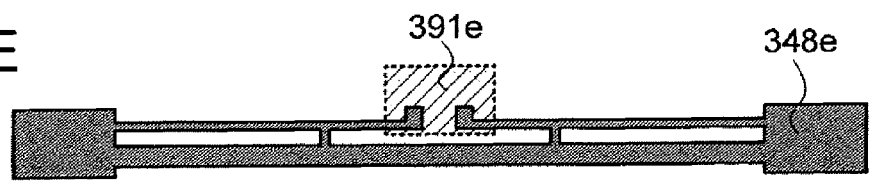

FIGS. 5A to 5E illustrate examples of a shape of the antenna. For example, as illustrated in FIG. 5A, a structure may be used in which an antenna 348a is disposed all around a driver circuit and a memory portion 391a. As illustrated in FIG. 5B, an antenna having a thin line width 348b may be provided in the area around a driver circuit and a memory portion 391b. As illustrated in FIG. 5C, the antenna may have a shape like an antenna 348c for receiving a high-frequency electromagnetic wave with respect to a driver circuit and a memory portion 391c. As illustrated in FIG. 5D, the antenna may have a shape like an antenna 348d which is 180° omnidirectional (capable of receiving signals in any direction) with respect to a driver circuit and a memory portion 391d. As illustrated in FIG. 5E, the antenna may have a shape like an antenna 348e which is extended to be long like a stick with respect to a driver circuit and a memory portion 391e. As the antenna 348 illustrated in FIGS. 4A and 4B, any of the antennas having the shapes illustrated in FIGS. 5A to 5E can be used in combination.

The appropriate length of the antenna depends on the frequency used for reception. For example, in the case where the frequency is 2.45 GHz, if a half-wave dipole antenna is provided, the antenna may have a length of about 60 mm (½ wavelength), and if a monopole antenna is provided, the antenna may have a length of about 30 mm (¼ wavelength).

Note that the driver circuit and each of the memory portions 391a to 391e collectively corresponds to a region including both the driver circuit portion 390 and the memory portion 392 which are illustrated in FIGS. 4A and 4B.

Then, separation is caused at the interface with the separation layer 304 or within the separation layer 304 which are illustrated in FIG. 4A, so that the element layer 360 is separated from the substrate 302.

Here, methods for separating the element layer 360 are listed below: (1) a method in which a stacked-layer structure of a metal layer and a layer containing metal oxide (or metal nitride) is provided as the separation layer 304 between the substrate 302 and the element layer 360, and the layer containing metal oxide is weakened by crystallization, so that the element layer 360 is physically separated from the substrate 302; (2) a method in which a stacked-layer structure of a metal layer and a layer containing metal oxide (or metal nitride) is provided as the separation layer 304 between the substrate 302 and the element layer 360, the layer containing metal oxide is weakened by crystallization, and part of the separation layer 304 is etched away using a solution or a halogen fluoride gas such as $NF_3$, $BrF_3$, or $ClF_3$, so that the element layer 360 is physically separated from the substrate 302; (3) a method in which the separation layer 304 is formed using amorphous silicon containing hydrogen between the substrate 302 and the element layer 360, and the separation layer 304 is irradiated with a laser beam to discharge a hydrogen gas, so that the substrate 302 is separated from the element layer 360; (4) a method in which the separation layer 304 is formed using amorphous silicon between the substrate 302 and the element layer 360, and the separation layer 304 is etched away using a solution or a halogen fluoride gas to cause separation; (5) a method in which the substrate 302 provided with the element layer 360 is mechanically shaved, or the substrate 302 is etched away using a solution or a halogen fluoride gas to cause separation; (6) a method in which an opening reaching the separation layer 304 is formed by laser beam irradiation in a position of the element layer 360 where a thin film transistor, an antifuse, an antenna, and the like are not formed, then the element layer 360 is physically separated from a substrate 302 with the opening used as a trigger; and the like. In the above-described separation methods (1) and (2), as the metal oxide layer or the metal nitride layer, a metal oxide layer or a metal nitride layer can be used which is obtained in forming an insulating layer over a metal layer formed as the separation layer. Further, in the above-described separation method (6), the opening reaching the separation layer 304 is formed, then part of the separation layer 304 may be etched away using a solution or a halogen fluoride gas which is introduced through the opening, and then physical separation may be performed.

As illustrated in FIG. 4B, the element layer 360 is sealed with a first sheet 350 and a second sheet 370. As the first sheet 350 and the second sheet 370, a plastic film, paper, thin ceramics, a sheet in which a textile of a carbon fiber or a glass fiber is impregnated with a resin (also referred to as a prepreg), or the like can be used. The first sheet 350 and the second sheet 370 can be bonded to each other using an adhesive layer such as an epoxy resin. By using a flexible material for the first sheet 350 and the second sheet 370 with which the element layer 360 is sealed, a semiconductor device to be obtained can be attached as a radio chip to a curved surface of an object or the like.

As the order of separation and sealing of the element layer 360, any of the following may be used: (1) the element layer 360 is separated from the substrate 302, then the first sheet 350 is bonded to the antenna side of the element layer 360 and the second sheet 370 is bonded to the side of the element layer 360 from which the substrate 302 is separated; (2) the first sheet 350 is bonded to the antenna side of the element layer 360, then the element layer 360 is separated from the substrate 302 and the second sheet 370 is bonded to the side of the element layer 360 from which the substrate 302 is separated; (3) before forming the antenna 348, layers from the insulating layer 306 to the conductive layers 344 and 346 are separated from the substrate 302, then the antenna 348 is formed, and the first sheet 350 and the second sheet 370 are bonded to each other; and the like. The order of separation and sealing of the element layer 360 can be changed by a practitioner, as appropriate.

Through the above-described steps, a semiconductor device that is a radio chip can be manufactured in which antifuse-type memory, a driver circuit including a thin film transistor, and an antenna are formed over the same substrate.

In a radio chip described in this embodiment mode, the antifuse 339 formed in the memory portion 392 is an antifuse according to the present invention. The present antifuse 339 is in one state selected from "the first state" which is an initial state, "the second state" which is a state where data has been written, or "the third state" where data has been written. "The first state", "the second state", and "the third state" are different from each other in an electric resistance. Further, "the second state" and "the third state" are obtained by writing data into the antifuse in "the first state". Note that as described above, the memory portion 392 includes a plurality of antifuses, and data is written into the antifuses in the memory portion 392 in blocks. Further, it is distinguished in blocks whether or not data has been written into the antifuses in the memory portion 392. An antifuse in "the first state" is present in a block where data has not been written, and only an antifuse in "the second state" or "the third state" is placed in a block where data has been written. The state of the antifuse in "the first state" is changed to "the second state" or "the third state" by writing data. However, the state of the antifuse which has been changed to "the second state" is not changed to "the third state" or "the first state" even when further writing is performed. The state of the antifuse which has been changed to "the third state" is not changed to "the second state" or "the first state" even when further writing is performed. In a block where data has been written of the memory included in the radio chip, the antifuse in "the second state" and the antifuse in "the third state" are placed. "The second state" and "the third state" are made to correspond to binary data, whereby data is written. As described above, the state of the antifuse in "the second state" or "the third state" is not changed to any of the other states such as the other writing state or the initial state even when further writing is performed. Therefore, there is no concern that data written into a radio chip that is an example of the present semiconductor device is falsified. Note that a writing method by which the state of the antifuse is changed to "the second state" or "the third state" may be selected as appropriate. Data may be written in antifuses, and further, it may be distinguished in antifuses whether or not data has been written.

Note that the semiconductor device described in this embodiment mode may be provided, as a radio chip, in the form of ROM which only includes a block where data has been written. In the block, the states of all antifuses are changed to "the second state" or "the third state" by writing data into all the antifuses, and "0" and "1" are fixed. Alternatively, the semiconductor device described in this embodiment mode may be provided, as a radio chip, in the form of write-once memory which includes a block where data has not been written and is provided with the antifuse in "the first state", so that the semiconductor device has a structure in which the state of the antifuse in "the first state" is changed to "the second state" or "the third state" by writing data into the antifuse as needed and thus data is written to make the block where data has not been written be in a state where data has been written. Further alternatively, the semiconductor device described in this embodiment mode may be provided, as a radio chip, in the form of write-once read-many memory which has a block where data has been written in which the state of the antifuse has been changed to "the second state" or "the third state" and a block where data has not been written which is provided with the antifuse in "the first state" which is the initial state.

That is, a radio chip according to this embodiment mode may be a chip where data has been written at the stage of providing the radio chip so that data can not be newly written, a chip where data is not written at all at the stage of providing the radio chip and data is newly written as needed, or a chip in part of which data has been written and data is newly written as needed.

In any of the above cases, in the radio chip according to this embodiment mode, data which has been once written can not be rewritten, so that falsification of data can be prevented.

Note that this embodiment mode can be freely combined with any of the other embodiment modes and embodiments.

[Embodiment 1]

In this embodiment, a method for manufacturing an active matrix semiconductor device provided with an antifuse-type memory will be described with reference to FIGS. 8A to 8D and FIGS. 9A and 9C. Here, an example is shown in which a radio chip provided with a logic circuit portion 550, a memory portion 552, and an antenna portion and power supply portion 554 over the same substrate is manufactured. Circuits including thin film transistors are integrated in the logic circuit portion 550. The memory portion 552 includes a plurality of antifuses. Note that, for convenience, FIGS. 8A to 8D and FIGS. 9A and 9C show cross sectional views each illustrating two thin film transistors included in the logic circuit portion 550, one antifuse and one thin film transistor which are included in the memory portion 552, and one capacitor and one thin film transistor included in the antenna portion and power supply portion 554.

First, a metal layer 502 serving as a separation layer is formed over a substrate 501. A glass substrate is used as the substrate 501. As the metal layer 502, a tungsten layer, a tungsten nitride layer, or a molybdenum layer with a thickness of 30 nm to 200 nm which is obtained by a sputtering method is used.

Next, a surface of the metal layer 502 is oxidized to form a metal oxide layer. The metal oxide layer may be formed by oxidation of the surface of the metal layer 502 with pure water or ozone water, or oxidation of the surface of the metal layer 502 with oxygen plasma. Alternatively, the metal oxide layer may be formed by heating in an atmosphere containing oxygen. Further alternatively, the metal oxide layer may be formed in a later step of forming an insulating layer serving as a separation layer which is formed over the metal layer 502. For example, when a silicon oxide layer or a silicon oxynitride layer is formed as the insulating layer by a plasma CVD method, the surface of the metal layer 502 is oxidized, so that the metal oxide layer is formed. Note that here, the metal oxide layer is not illustrated.

Next, a first insulating layer 503 is formed over the metal layer 502. An insulating layer such as a silicon oxide layer, a silicon nitride layer, or a silicon oxynitride layer is formed as the first insulating layer 503. As an example of the first insulating layer 503, a two-layer structure can be given in which a silicon nitride oxide layer having a thickness of 50 nm to 100 nm which is formed by a plasma CVD method using $SiH_4$, $NH_3$, and $N_2O$ as reactive gases, and a silicon oxynitride layer having a thickness of 100 nm to 150 nm which is formed by a plasma CVD method using $SiH_4$ and $N_2O$ as reactive gases are stacked. When the first insulating layer 503 has a stacked-layer structure, as at least one layer of the first insulating layer 503, a silicon nitride layer or a silicon oxynitride layer each having a thickness of less than or equal to 10 nm is preferably formed. Alternatively, a three-layer structure may be employed in which a silicon nitride oxide layer, a silicon oxynitride layer, and a silicon nitride layer are sequentially stacked. Although the first insulating layer 503 serves as a base insulating layer, it is not necessarily provided if it is not particularly needed. Further, a base insulating layer such as a silicon oxide layer or a silicon nitride layer may be provided between a separation layer (here, the metal layer 502) and the substrate.

Next, a semiconductor layer is formed over the first insulating layer 503. The semiconductor layer is formed as follows: a semiconductor layer having an amorphous structure is formed by a CVD method such as an LPCVD method or a plasma CVD method, or a sputtering method, and then crystallized to obtain a crystalline semiconductor layer, and the crystalline semiconductor layer is selectively etched into a desired shape. As a crystallization method, a laser crystallization method, a thermal crystallization method using RTA or an annealing furnace, a crystallization method using a metal element, such as nickel, which promotes crystallization, or the like can be used. Note that when the semiconductor layer is formed by a plasma CVD method, the first insulating layer 503 and the semiconductor layer having an amorphous structure can be successively formed without exposure to the air. The semiconductor layer is formed to a thickness of 25 nm to 80 nm (preferably 30 nm to 70 nm). Although there is no particular limitation on a material of the semiconductor layer, silicon, a silicon germanium, or the like is preferably used.

Alternatively, for crystallization treatment of the semiconductor layer having an amorphous structure, a continuous wave laser can be used. In order to obtain a crystal with a large grain size in crystallization of the semiconductor layer having an amorphous structure, it is preferable to employ second to fourth harmonics of a solid laser capable of continuous wave oscillation. Typically, the second harmonic (532 nm) or the third harmonic (355 nm) of an Nd:YVO$_4$ laser (fundamental wave of 1064 nm) may be employed. When a continuous wave laser is used, a laser beam emitted from a continuous wave YVO$_4$ laser with 10 W output is converted into a harmonic by a non-linear optical element. In addition, there is a method by which YVO$_4$ crystal and a non-linear optical element are put in a resonator and a harmonic wave is emitted. Then, the laser beam is preferably shaped into a rectangular or elliptical shape on an irradiation surface by an optical system and is emitted to an object to be processed. At this time, an energy density of approximately 0.01 MW/cm$^2$ to 100 MW/cm$^2$ (preferably, 0.1 MW/cm$^2$ to 10 MW/cm$^2$) is needed. Then, the semiconductor layer may be moved at a speed of approximately 10 cm/sec to 2000 cm/sec relatively to the laser beam so as to be irradiated.

Note that if necessary, a small amount of an impurity element (boron or phosphorus) is added to the semiconductor layer in order to control a threshold value of a thin film transistor to be completed later. Here, boron is added by an ion doping method in which diborane (B$_2$H$_6$) is excited by plasma without mass separation.

Next, a surface of the semiconductor layer is washed at the same time as removal of an oxide film on the surface of the semiconductor layer with an etchant containing hydrofluoric acid. Then, a second insulating layer which covers the semiconductor layer is formed. The second insulating layer is formed to a thickness of 1 nm to 200 nm by a CVD method or a sputtering method. Preferably, an insulating layer containing silicon is formed to be as thin as 10 nm to 50 nm to have a single layer or a stacked-layer structure, and then surface nitridation treatment is performed using plasma excited by a microwave. The second insulating layer functions as a gate insulating layer of a thin film transistor to be formed later.

Note that in order to make the semiconductor layer in a region to be a capacitor later function as a conductor, an impurity element (boron or phosphorus) is added to the semiconductor layer at a high concentration. At this time, a region except the region to be the capacitor may be covered with a resist mask.

Next, gate electrodes 504, 505, 506, 507 and 508 and a first electrode 509 which functions as a lower electrode of the antifuse are formed over the second insulating layer. A conductive layer having a thickness of 100 nm to 500 nm which is obtained by a sputtering method is selectively etched and processed into a desired shape, so that the gate electrodes 504 to 508 and the first electrode 509 are obtained.

As a material of the gate electrodes 504 to 508 and the first electrode 509, a substance such as tungsten, titanium, aluminum, nickel, chromium, molybdenum, tantalum, cobalt, zirconium, vanadium, palladium, hafnium, platinum, or iron; a single layer structure or a stacked layer structure of a material selected from an alloy thereof or a compound thereof can be used. The material which reacts with silicon to form a silicide is preferably used. Note that a high melting point metal is preferably used as the gate electrode of the thin film transistor. Specifically, tungsten or molybdenum can be given. In the case where the gate electrodes 504 to 508 and the first electrode 509 each have a stacked-layer structure, a material layer which serves as an upper layer may be formed using the above-described material, and a material layer which serves as a lower layer of the gate insulating layer side may be a polysilicon layer to which an impurity element such as phosphorus is added.

Next, a resist mask is formed so as to cover the semiconductor layers in regions to be p-channel transistors, and an impurity element is introduced into the semiconductor layers in regions to be n-channel transistors, using the gate electrodes 505, 506, and 507 as masks, so that low-concentration impurity regions are formed. As the impurity element, an impurity element imparting n-type conductivity or an impurity element imparting p-type conductivity can be used. As the impurity element imparting n-type conductivity, phosphorus (P), arsenic (As), or the like can be used. Here, phosphorus is introduced into the semiconductor layers in the regions to be the n-channel transistors so as to be contained at concentrations of 1×10$^{15}$/cm$^3$ to 1×10$^{19}$/cm$^3$, so that n-type impurity regions are formed.

Next, the resist mask is removed. A resist mask is formed so as to cover the semiconductor layers to be the n-channel transistors, and an impurity element is introduced into the semiconductor layer to be the p-channel transistors, using the gate electrodes 504 and 508 as masks, so that p-type impurity regions are formed. As the impurity element imparting p-type conductivity, boron (B), aluminum (Al), gallium (Ga), or the like can be used. Here, boron (B) is introduced into the semiconductor layer in the region to be the p-channel transistors so as to be contained at concentrations of 1×10$^{19}$/cm$^3$ to 1×10$^{20}$/cm$^3$, so that the p-type impurity regions can be formed. Consequently, a channel formation region 516a and a pair of p-type impurity regions 514a, and a channel formation region 516b and a pair of impurity region 514b are formed in a self-aligned manner in the semiconductor layers in the regions to be the p-channel transistors. The p-type impurity regions 514a and 514b each function as a source region or a drain region.

Next, sidewall insulating layers 510 and sidewall insulating layers 511 are formed on side surfaces of the gate electrodes 504 to 508 and side surfaces of the first electrode 509. A formation method of the sidewall insulating layers 510 and 511 is as follows: first, a third insulating layer is formed to have a single-layer structure or a stacked-layer structure of a layer containing silicon, an oxide of silicon, or a nitride of silicon, or a layer containing an organic material such as an organic resin by a plasma CVD method, a sputtering method, or the like so as to cover the second insulating layer, the gate electrodes 504 to 508, and the first electrode 509. Then, the third insulating layer is selectively etched by anisotropic etching mainly in a perpendicular direction to form insulating layers (the sidewall insulating layers 510 and 511) which are in contact with the side surfaces of the gate electrodes 504 to 508 and the first electrode 509. Note that part of the second insulating layer is removed by being etched at the same time as the formation of the sidewall insulating layers 510. The part of the second insulating layer is removed, so that a gate insulating layer 512 is formed under each of the gate electrodes 504 to 508 and the sidewall insulating layers 510. In addition, the part of the second insulating layer is removed, so that an insulating layer 513 is formed under the first electrode 509 and the sidewall insulating layers 511.

Next, a resist mask is formed so as to cover the semiconductor layers in regions to be the p-channel transistors, and an impurity element is introduced into the semiconductor layers in the regions to be the n-channel transistors, using the gate electrodes 505, 506, and 507 and the sidewall insulating layers 510 as masks, so that high-concentration impurity regions are formed. The resist mask is removed after the impurity element is introduced. Here, phosphorus (P) is introduced into the semiconductor layers in the regions to be the n-channel transistors so as to be contained at concentrations of $1\times10^{19}/cm^3$ to $1\times10^{20}/cm^3$, so that n-type high-concentration impurity regions can be formed. Consequently, a channel formation region 521a, a pair of low-concentration impurity regions 519a serving as LDD regions, and a pair of high-concentration impurity regions 517a each serving as a source region or a drain region; and a channel formation region 521c, a pair of low-concentration impurity regions 519c serving as LDD regions, and a pair of high-concentration impurity regions 517c each serving as a source region or a drain region are formed in a self-aligned manner in the semiconductor layers in the regions to be the n-channel transistors. At the same time, a first impurity region 521b, second impurity regions 519b, and third impurity regions 517b are formed in a self-aligned manner in the semiconductor layer in a region to be a capacitor. The first impurity region 521b is formed in a region overlapping with the gate electrode 506 with the gate insulating layer interposed therebetween. Note that an impurity element is selectively added at a high concentration to the first impurity region 521b before formation of the gate electrode 506. Accordingly, the impurity concentration of the first impurity region 521b is higher than those of the channel formation regions 521a and 521c. Note that the low-concentration impurity regions 519a and 519c which function as LDD regions and the second impurity regions 519b are formed under the sidewall insulating layers 510.

Note that the structure is described in which the LDD regions are formed in the semiconductor layer included in the n-channel thin film transistor and the LDD regions are not formed in the semiconductor layer included in the p-channel thin film transistor; however, the present invention is not limited thereto. The LDD regions may be formed in the semiconductor layers included in both the n-channel thin film transistor and the p-channel thin film transistor.

Next, a fourth insulating layer 522 containing hydrogen is deposited by a sputtering method, an LPCVD method, a plasma CVD method, or the like, and then activation treatment and hydrogenation treatment of the impurity element added to the semiconductor layer are performed. Heat treatment (at a temperature of 300° C. to 550° C. for 1 to 12 hours) in a furnace or an RTA method using a lamp light source is used for the activation treatment and hydrogenation treatment of the impurity element. For example, a silicon nitride oxide layer which is obtained by a plasma CVD method is used for the fourth insulating layer 522 containing hydrogen. Here, the thickness of the fourth insulating layer 522 containing hydrogen is 50 nm to 200 nm. Besides, in the case where the semiconductor layer is crystallized using a metal element which promotes crystallization, typically nickel, gettering which reduces nickel in the channel formation region can also be performed at the same time as the activation. Note that the fourth insulating layer 522 containing hydrogen is a first layer of an interlayer insulating layer.

Next, a fifth insulating layer 523 which serves as a second layer of the interlayer insulating layer is formed by a sputtering method, an LPCVD method, a plasma CVD method, or the like. An insulating layer in a single layer or stacked layers such as a silicon oxide layer, a silicon nitride layer, or a silicon oxynitride layer is used as the fifth insulating layer 523. Here, the thickness of the fifth insulating layer 523 is 300 nm to 800 nm.

Next, a resist mask is formed over the fifth insulating layer 523 and the fourth insulating layer 522 and the fifth insulating layer 523 are selectively etched, so that a first opening 520 reaching the first electrode 509 is formed. The resist mask is removed after the etching. A diameter of the first opening 520 may be approximately 1 μm to 6 μm. In this embodiment, the diameter of the first opening 520 is 2 μm.

A cross-sectional view of the semiconductor device manufactured through the preceding steps corresponds to FIG. 8A.

Next, a silicon oxynitride layer and an amorphous silicon layer are stacked using a sputtering method, an LPCVD method, a plasma CVD method, or the like. In this embodiment, a silicon oxynitride layer with a thickness of 3 nm to 5 nm and an amorphous silicon layer with a thickness of 30 nm are sequentially formed by a plasma CVD method to be stacked. Then, a resist mask is formed and the amorphous silicon layer and the silicon oxynitride layer are selectively etched, so that a silicon oxynitride layer 524a and an amorphous silicon layer 524b which overlap with the first opening 520 are formed. The silicon oxynitride layer 524a and the amorphous silicon layer 524b will collectively function as a resistance material layer of the antifuse. The resist mask is removed after the etching.

A cross-sectional view of the semiconductor device manufactured through the preceding steps corresponds to FIG. 8B.

Next, a resist mask is formed and the fourth insulating layer 522 and the fifth insulating layer 523 are selectively etched, so that contact holes reaching the semiconductor layers, contact holes reaching the gate electrodes, and a second opening reaching the first electrode 509 are formed. The resist mask is removed after the etching.

A cross-sectional view of the semiconductor device manufactured through the preceding steps corresponds to FIG. 8C.

Next, oxide films formed on exposed surfaces of the semiconductor layers and on an exposed surface of the first electrode 509 are removed with an etchant containing hydrofluoric acid, and at the same time, the exposed surfaces of the semiconductor layers and the exposed surface of the first electrode 509 are washed.

Next, a conductive layer is formed by a sputtering method to form an upper electrode of the antifuse, the source and drain electrodes of the thin film transistors, and the like. This conductive layer is formed in a single layer or stacked layers of a substance such as tungsten, titanium, aluminum, nickel, chromium, molybdenum, tantalum, cobalt, zirconium, vanadium, palladium, hafnium, platinum, or iron, or an alloy or a compound thereof. However, in the case where the conductive layers are stacked, one layer which is in contact with the amorphous silicon layer 524b is preferably formed using a material which reacts with silicon in order to be used for the upper electrode of the antifuse. Further, this conductive layer is also used for the source and drain electrodes of the thin film transistors. Therefore, it is preferable to use a material which has relatively low contact resistance with the semiconductor layer of the thin film transistor. For example, a three-layer structure of a titanium layer, an aluminum layer containing a minute amount of silicon, and a titanium layer or a three-layer structure of a titanium layer, an aluminum alloy layer containing nickel and carbon, and a titanium layer is employed. In this embodiment, a three-layer structure of a 100 nm thick titanium layer, a 350 nm thick pure aluminum layer, and a 100 nm thick titanium layer is employed. Further, this embodiment describes the example in which a tungsten layer is used as a material of the lower electrode of the antifuse and a titanium layer is used as a material of the upper electrode. However, the materials are not particularly limited as long as they can change the state of the resistance material layer from a high resistance state to a low resistance state and the same material may be used for the upper electrode and the lower electrode of the antifuse. When the lower electrode and the upper electrode of the antifuse are formed using the same material, they are formed to have a single layer structure or a stacked-layer structure of a material which is selected from a substance such as tungsten, titanium, aluminum, nickel, chromium, molybdenum, tantalum, cobalt, zirconium, vanadium, palladium, hafnium, platinum, or iron, an alloy material or a compound material thereof.

Next, a resist mask is formed, and the conductive layer is selectively etched, so that conductive layers 525, 526, 527, 528, 529, 530, 531, 532, 533, and 534 which function as source or drain electrodes, wirings 535, 536, 537, 538, and 539 which function as gate lead wirings, a second electrode 540 and a third electrode 541 of a memory portion, and a fourth electrode 542 of an antenna portion are formed. The second electrode 540 overlaps with the first opening 520 to function as the upper electrode of the antifuse. In addition, the third electrode 541 overlaps with the second opening to be electrically connected to the first electrode 509. Note that the fourth electrode 542 is electrically connected to thin film transistors of the antenna portion and the power supply portion, though the connection is not illustrated here. The resist mask is removed after the etching.

A cross-sectional view of the semiconductor device manufactured through the preceding steps corresponds to FIG. 8D. In this embodiment, thin film transistors of the logic circuit portion 550, a thin film transistor and an antifuse 560 of the memory portion 552, and thin film transistors of the antenna portion and power supply portion 554 can be formed over the same substrate. Here, a cross-sectional view of a p-channel thin film transistor and an n-channel thin film transistor which are provided in the logic circuit portion 550, a p-channel thin film transistor and the antifuse 560 which are provided in the memory portion 552, and a capacitor and an n-channel thin film transistor which are provided in the antenna portion and power supply portion 554 is shown. Note that the present invention is not limited thereto and the thin film transistor provided in the memory portion 552 may be an n-channel thin film transistor. Further, a p-channel thin film transistor may be provided in the antenna portion and power supply portion 554. Here, one n-channel thin film transistor is illustrated for convenience.

Next, a sixth insulating layer 543 which covers the thin film transistors of the logic circuit portion 550, the thin film transistor and the antifuse of the memory portion 552, and the thin film transistor of the antenna portion and power supply portion 554, is formed. An insulating layer containing silicon oxide or an insulating layer containing an organic resin can be used as the sixth insulating layer 543. The insulating layer containing silicon oxide is preferably used to improve reliability of a radio chip. Alternatively, an insulating layer containing an organic resin formed by a coating method is preferably used because the sixth insulating layer 543 preferably has a planarized surface in the case where an antenna to be formed later is formed by a screen printing method. The material for forming the sixth insulating layer 543 may be selected by a practitioner as appropriate. Further, the antenna to be formed later may be formed so as to reach a region which overlaps with the logic circuit portion 550 and the memory portion 552. In this case, the sixth insulating layer 543 also functions as an interlayer insulating layer which isolates elements in the logic circuit portion 550 and elements in the memory portion 552, from the antenna. In the case where the antenna has a circular shape (for example, a loop antenna) or a spiral shape, one of both ends of the antenna is led by a wiring of a lower layer; thus, it is preferable to provide the sixth insulating layer 543. However, in the case where a microwave method is employed and the antenna has a linear shape (for example, a dipole antenna), a flat shape (for example, a patch antenna), or the like, the antenna to be formed later can be arranged so as not to overlap with the logic circuit portion and the memory portion; thus, the sixth insulating layer 543 is not necessarily provided.

Next, a resist mask is formed, and the sixth insulating layer 543 is selectively etched, so that a third opening reaching the third electrode 541 and a fourth opening reaching the fourth electrode 542 are formed. The resist mask is removed after the etching.

A cross-sectional view of the semiconductor device manufactured through the preceding steps corresponds to FIG. 9A.

Next, a metal layer is formed over the sixth insulating layer 543. A single layer which is selected from Ti, Ni, and Au or stacked layers thereof are used as the metal layer. Then, a resist mask is formed, and the metal layer is selectively etched, so that a lead wiring 544 is formed in a lead wiring portion 562 of the first electrode 509 and a base layer 545 of the antenna is formed. Note that the lead wiring 544 and the base layer 545 here can be selectively formed by a sputtering method using a metal mask without using the resist mask, as well. When the base layer 545 of the antenna is provided, a large contact area with the antenna can be secured. In addition, the lead wiring 544 is not necessarily formed depending on a layout of a circuit design.

A cross-sectional view of the semiconductor device manufactured through the preceding steps corresponds to FIG. 9B.

Next, an antenna 546 is formed over the base layer 545 of the antenna. The antenna 546 can be formed by such a method in which a metal layer of Al, Ag, or the like is formed by a sputtering method and then is selectively etched into a desired shape. Alternatively, the antenna 546 can be formed by a screen printing method. A screen printing method is as follows: by using a screen plate, in which a base which is made of a metal mesh or a high molecular compound fiber mesh and is provided with a predetermined pattern formed by a photosensitive resin, and a rubber, plastic, or metal blade which is called a squeegee, an ink or a paste which is provided on the screen plate is transferred to a work which is placed on the opposite side of the screen plate. A screen printing method has a merit that pattern formation in a relatively large area is realized at low cost.

A cross-sectional view of the semiconductor device manufactured through the preceding steps corresponds to FIG. 9C. In this embodiment, the thin film transistors of the logic circuit portion 550, the thin film transistor and the antifuse of the memory portion 552, and the thin film transistor and the antenna of the antenna portion and power supply portion 554 can be formed over the same substrate.

Next, the metal layer 502 and the substrate 501 are removed by separation. Separation can occur inside the metal oxide layer, at the interface between the first insulating layer 503 and the metal oxide layer, or the interface between the metal oxide layer and the metal layer 502, so that a portion which is over the first insulating layer 503 to be the radio chip can be separated from the substrate 501 with relatively less force. When the metal layer 502 and the substrate 501 are removed, a fixing substrate may be attached to the side where the antenna is provided.

Next, one sheet over which a plurality of radio chips are formed is divided by a cutter, dicing, or the like so as to be divided into individual radio chips. In addition, with the use of a method in which each radio chip is picked up and separated, this dividing step is not needed.

Next, the radio chip is fixed to a sheet-like base. As the sheet-like base, plastic, paper, a prepreg, a ceramic sheet, or the like can be used. The radio chip may be fixed so as to be interposed between two sheet-like bases, or the radio chip may be fixed to one sheet-like base with a bonding layer As the bonding layer, various curable adhesives such as a reactive curable adhesive, a thermosetting adhesive, and a photo curable adhesive such as an ultraviolet curable adhesive, and an anaerobic adhesive can be used. Alternatively, the radio chip can be arranged in the middle of making paper, thereby being provided inside one piece of paper.

The radio chip manufactured through the preceding steps includes an antifuse according to the present invention. The present antifuse is in one state selected from "the first state" which is the initial state, "the second state" in which data has been written, or "the third state" in which data has been written. "The first state", "the second state", and "the third state" are different from each other in an electric resistance. Further, "the second state" and "the third state" are obtained by writing data into the antifuse in "the first state". Note that as described above, the memory includes a plurality of antifuses, and data is written in blocks. Further, it is distinguished in blocks whether or not writing has been performed. An antifuse in "the first state" is present in a block where data has not been written, and only an antifuse in "the second state" or "the third state" is placed in a block where data has been written. The state of the antifuse in "the first state" is changed to "the second state" or "the third state" by writing data. Further, the state of the antifuse which has been changed to "the second state" is not changed to "the third state" or "the first state" even when further writing is performed. Similarly, the state of the antifuse which has been changed to "the third state" is not changed to "the second state" or "the first state" even when further writing is performed. In a block where data has been written of the memory included in the radio chip, the antifuse in "the second state" and the antifuse in "the third state" are placed. "The second state" and "the third state" are made to correspond to binary data, whereby data is written. As described above, the state of the antifuse in "the second state" or "the third state" is not changed to any of the other states such as the other writing state or the initial state even when further writing is performed. Therefore, there is no concern that data written into a radio chip is falsified. Further, when a block where data has not been written including the antifuse in "the first state" is left in the radio chip, write-once read-many memory where new data can be written (additionally) can be realized. Note that writing data or distinguishing whether or not data has been written may also be performed in antifuses.

Further, the radio chip can be provided as a ROM including only a block where data has been written which is manufactured in such a manner that the state of each antifuse is changed to "the second state" or "the third state" by performing writing at the time of manufacturing the radio chip or after manufacturing the radio chip, the binary data is fixed and data is written. Alternatively, when the radio chip is provided, it can be provided as write-once read-many memory including antifuses in "the first state" where only new data can be written. In a case of write-once read-many memory, a structure provided with only a block where data has not been written or a structure provided with a block where data has not been written and a block where data has been written may be employed. In any case, a radio chip in which falsification of data once written is impossible and data can be written additionally as needed can be provided. For example, after a radio chip fixed to a flexible sheet-like base is attached to an article with a curved surface, data can be input to an antifuse-type memory included in the radio chip.

This embodiment can be freely combined with any of the embodiment modes.

[Embodiment 2]

In this embodiment, a structure example and an operation example of a semiconductor device functioning as a radio chip will be described.

Figure 6A:
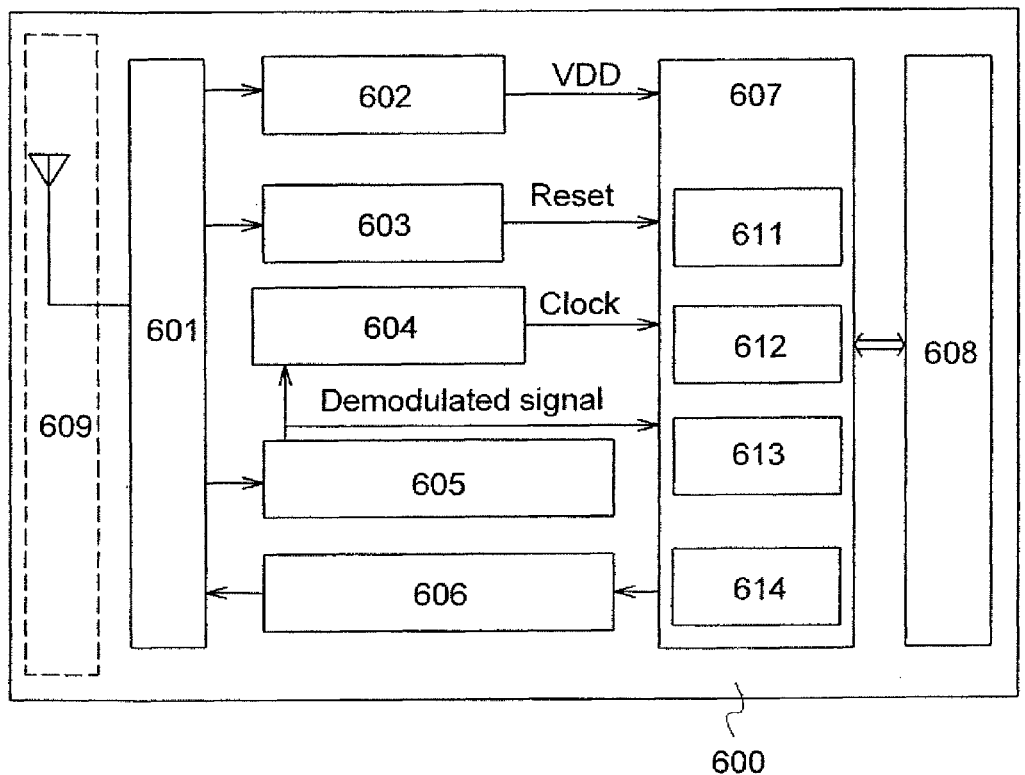
FIG. 6A is a block diagram illustrating an example of a semiconductor device according to an aspect of the present invention and FIGS. 6B and 6C are diagrams illustrating examples of usage modes thereof.

A semiconductor device described in this embodiment is a radio chip having a function of communicating data without contact. A semiconductor device 600 illustrated in a block diagram of FIG. 6A is an example thereof and includes a high frequency circuit 601, a power supply circuit 602, a reset circuit 603, a clock generating circuit 604, a data demodulation circuit 605, a data modulation circuit 606, a control circuit 607 which controls other circuits, a memory circuit 608, and an antenna 609.

The memory circuit 608 has memory including the antifuse of the present invention. Further, the memory circuit 608 has a circuit which performs writing on the memory which is described as part of the driver circuit portion in Embodiment Mode 4 and Embodiment 1 or a circuit which reads data written into the memory in some cases. Furthermore, the memory circuit 608 may have memory with a different structure in addition to memory including antifuses. As a memory with a different structure, for example, DRAM, SRAM, FeRAM, PROM, EPROM, EEPROM, flash memory, or the like can be given. Note that the memory circuit 608 has memory including the present antifuses, and the memory including the antifuses may be ROM or write-once memory. Note that the antifuse where data has been written is inevitably in "a second state" or "a third state". In the case of write-once memory, an antifuse in "the first state" is present.

The high frequency circuit 601 receives a signal from the antenna 609, and outputs a signal received from the data modulation circuit 606, from the antenna 609. The power supply circuit 602 generates a power supply potential from a received signal. The reset circuit 603 generates a reset signal. The clock generating circuit 604 generates various clock signals based on a received signal input from the antenna 609. The data demodulation circuit 605 demodulates a received signal and outputs the demodulated signal to the control circuit 607. The data modulation circuit 606 modulates a signal received from the control circuit 607. In the control circuit 607 here, a code extraction circuit 611, a code determination circuit 612, a CRC determination circuit 613, and an output unit circuit 614 are included. Note that the code extraction circuit 611 is a circuit which extracts a plurality of codes included in an instruction transmitted to the control circuit 607, the code determination circuit 612 is a circuit which judges the content of the instruction by comparing the extracted code with a reference code, and the CRC determination circuit 613 is a circuit which detects the presence of transmission errors and the like based on the judged code.

Next, an example of an operation of the above-described semiconductor device 600 will be described. First, a radio signal is received by the antenna 609. The radio signal is transmitted to the power supply circuit 602 through the high frequency circuit 601, so that a high power supply potential (hereinafter referred to as VDD) is generated by the power supply circuit 602. The VDD is supplied to various circuits in the semiconductor device 600. A signal transmitted to the data demodulation circuit 605 through the high frequency circuit 601 is demodulated (hereinafter, such a signal is referred to as a demodulated signal). Moreover, signals passed through the reset circuit 603 and the clock generating circuit 604 through the high frequency circuit 601, and the demodulated signal are transmitted to the control circuit 607. The signal transmitted to the control circuit 607 is analyzed by the code extraction circuit 611, the code determination circuit 612, the CRC determination circuit 613, and the like. Then, based on the analyzed signals, data is written into the memory circuit 608 or data of the semiconductor device 600 which is written in the memory circuit 608 is output.

In the case where data is written into the memory circuit 608, for example, data is written into the antifuse included in the memory circuit 608 in blocks, whereby data is written. At this time, writing is inevitably performed on the antifuses in a block where data is to be written, whereby the state of each of the antifuses is changed from "a first state" of an initial state to "the second state" or from "the first state" to "the third state". Writing data into the present antifuse may be directly performed by a radio signal or may be performed through a circuit which instructs writing into the memory. Note that even if data is written into the antifuse in "the second state" in accordance with the analyzed signal, the state of the antifuse is not changed to "the first state" or "the third state". Even if data is written into the antifuse in "the third state" in accordance with the analyzed signal, the state of the antifuse is not changed to "the second state" or "the first state". Accordingly, it is impossible to rewrite data once written. When there exists a block where data has not been written, which includes antifuses which are in "the first state", new data can be written. However, a case where the memory circuit 608 includes memory except the memory which has the antifuses of the present invention is not limited to this.

When data written into the memory circuit 608 is output, the data is read in accordance with the analyzed signal. The memory circuit 608 includes memory which has the present antifuses. In the block where data has been written, antifuses in "the second state" or "the third state" are present and the data has been written. Reading from the antifuse may be performed directly by a radio signal or may be performed through a circuit which instructs reading of the data written to the memory.

The output data of the semiconductor device 600 is encoded through the output unit circuit 614. Furthermore, the encoded data of the semiconductor device 600 passes through the data modulation circuit 606 and is converted into a radio signal by the antenna 609 to be transmitted. Note that a low power source potential (hereinafter called VSS) is common in the various circuits included in the semiconductor device 600, and VSS can be set to VGND.

In such a semiconductor device 600, data can be written by a radio signal with the use of a communication device which can transmit or receive or which can transmit and receive a radio signal (e.g. a reader/writer, or a communication device having a function of one of a reader and a writer). Further, the data written in the semiconductor device 600 can be read by a radio signal.

Note that the semiconductor device 600 may supply a power supply voltage to various circuits by an electromagnetic wave without a power source (battery) mounted, or by an electromagnetic wave and a power source (battery) with the power source (battery) mounted.

Figure 6B:
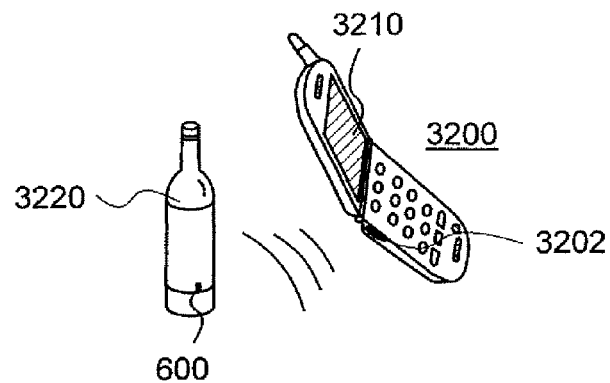

Next, an example of a use mode of a semiconductor device according to the present invention, which functions as a radio chip, will be described. FIG. 6B illustrates a portable data terminal 3200 and a product 3220.

The portable data terminal 3200 has a display portion 3210 and a communication unit 3202 on a side surface. As an example of the communication unit 3202, a reader/writer having a function of reading and transmitting a signal, a reader having a function of only reading a signal, or a writer having a function of transmitting a signal can be given.

The semiconductor device 600 is attached to the product 3220. The semiconductor device 600 functions as the radio chip described above, and a variety of data such as a raw material and a place of origin of the product 3220 can be written into the semiconductor device 600. Note that for example, a flag is placed in a block where data has been written so that it is judged the data has been written into the block. Since the semiconductor device 600 of the present invention has a structure in which falsification of data once written can be prevented, there is no possibility that the data such as a raw material and a place of origin is rewritten as false data. It is possible to make a block where data has not been written be present in the semiconductor device 600 to additionally write data thereinto, and for example, an inspection result for each production step, a history of the distribution process, and the like can be written into the block where data has not been written. In this case, a plurality of blocks where data has not been written is provided so that writing can be performed in each production step. After data has been written into the blocks where data has not been written, the blocks where data had not been written are judged as blocks where data has been written.

The portable data terminal 3200 having the communication unit 3202 is held to the semiconductor device 600 attached to the product 3220. The communication unit 3202 reads the data written into the semiconductor device 600 and the data such as a raw material, a place of origin, an inspection result for each production step, or a history of the distribution process of the product 3220 can be displayed in the display portion 3210.

Figure 6C:
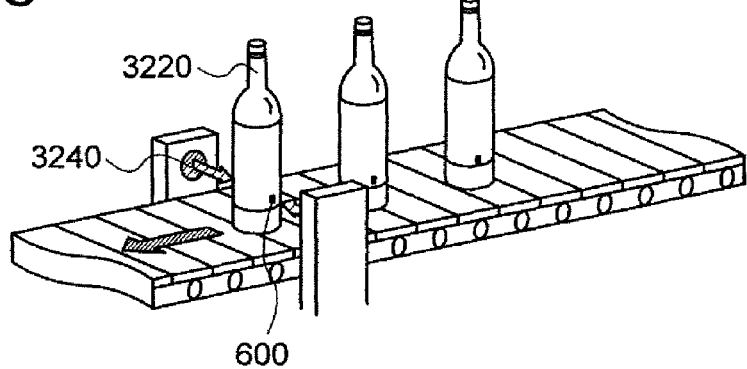
Figure 7A:
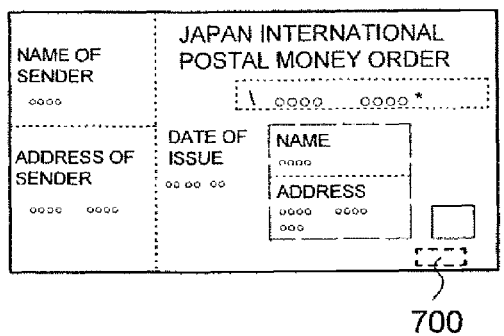
FIGS. 7A to 7H are diagrams illustrating application examples of a semiconductor device according to an aspect of the present invention.
Figure 7B:
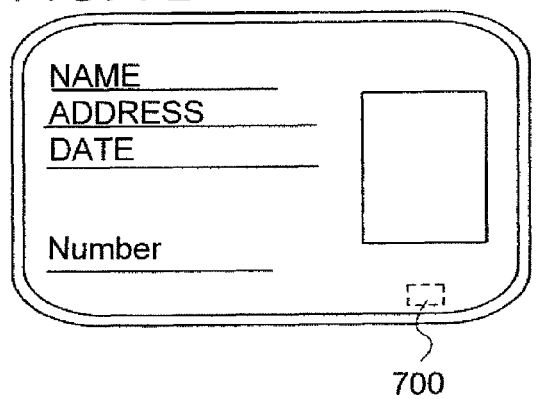
Figure 7C:
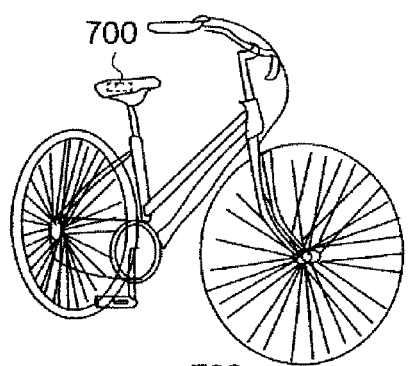
Figure 7D:
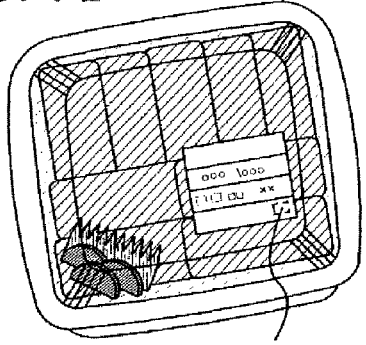
Figure 7E:
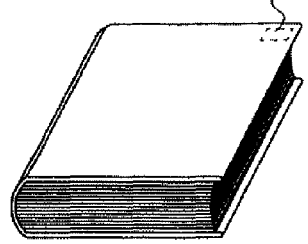
Figure 7F:
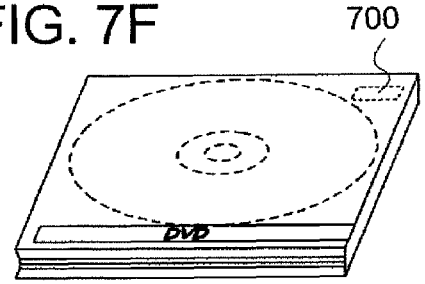
Figure 7G:
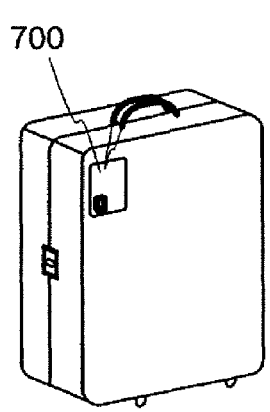
Figure 7H:
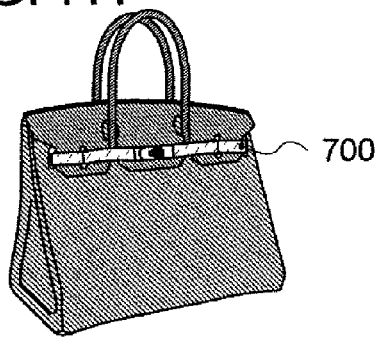

Further, as illustrated in FIG. 6C, when the product 3220 to which the semiconductor device 600 is attached is transferred by a conveyer belt, the data in the semiconductor device 600 is read by a communication unit 3240, whereby the product 3220 can be inspected. Furthermore, the inspection result can be written as data into the semiconductor device 600. Thus, by utilizing the semiconductor device of the present invention for a system, data can be acquired easily, and improvement in performance and added value of the system can be achieved. Since falsification of data once written is prevented, forgery of a product can be prevented.

Note that applications of the present semiconductor device is wide in addition to the above, and the present semiconductor device can be applied to any product as long as it needs to have definite data of production, distribution, sales, or management of an object. For example, the semiconductor device can be attached to paper money, coins, securities, certificates, bearer bonds, packing containers, books, recording media, personal belongings, luggage, vehicles, food, clothes, health products, commodities, medicine, electronic devices, and the like. Examples of these will be described with reference to FIGS. 7A to 7H. Note that FIGS. 7A to 7H each illustrate an example in which a radio chip 700 is provided as the semiconductor device 600.

The paper money and coins are money that circulates in the market, and include one that can be used in the same way as money in a specific area (cash voucher), memorial coins, and the like. The securities refers to checks, certificates, promissory notes, and the like (see FIG. 7A). The certificates include driver's licenses, resident cards, and the like (see FIG. 7B). The vehicles include wheeled vehicles such as bicycles, vessels, and the like (see FIG. 7C). The packing containers include paper for wrapping a lunch box or the like, plastic bottles, and the like (see FIG. 7D). The books include hardbacks, paperbacks, and the like (see FIG. 7E). The recording media include DVD software, video tapes, and the like (see FIG. 7F). The personal belongings include bags, glasses, and the like (see FIG. 7H). The luggage includes baggage, express package, and the like (see FIG. 7G). The bearer bonds refer to stamps, rice coupons, various gift certificates, and the like. The foods include food items, beverages, and the like. The clothes include clothing, footwear, and the like. The health products include medical devices, health appliances, and the like. The commodities include furniture, lighting apparatus, and the like. The medicals include medicines, agricultural chemicals, and the like. Electric devices include liquid crystal display devices, EL display devices, television devices (television receivers and flat-screen television receivers), cellular phones, and the like.

By providing the radio chip 700 for paper money, coins, certificates, bearer bonds, and the like, forgery can be prevented. The efficiency of an inspection system, a system used in a rental shop, or the like can be improved by providing the radio chip 700 for the packing containers, the books, the recording media, the personal belongings, the food, the commodities, the luggage, the electronic devices, or the like. Forgery or theft can be prevented by providing the radio chip 700 for the vehicles, the health products, the medicine, the luggage, or the like; and in the case of the medicine, medicine can be prevented from being taken mistakenly. As for medicines, medicine can be prevented from being taken mistakenly. The radio chip 700 is provided by being attached to a surface of an article or being embedded in an article. For example, in the case of a book, the radio chip may be embedded in a piece of paper; in the case of a package made from an organic resin, the radio chip may be embedded in the organic resin. In addition, when the radio chip is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

In particular, it is effective to use a radio chip to which the present invention is applied for traceability of the food. The radio chip to which the present invention is applied has a structure in which new data can be written, but data once written cannot be rewritten. Accordingly, when a vendor changes in each step of production, distribution, sales, and the like of the food, the following vendor cannot perform falsification of the data which the previous vendor writes. For example, false labeling in which a seller falsifies data such as shelf life which has been written by a producer can be prevented.

Here, an example is described in which a radio chip to which the present invention is applied is used for traceability of the food. For example, an example is described in which a radio chip to which the present invention is applied is used for distribution of beef.

First, target beef cattle A is born in a stock farm S, for example. An administrator of the beef cattle A (a feeder of beef cattle, an administrator of a common nurturing and raising center of beef cattle, a breeding center of beef cattle, or a fattening center of beef cattle, an administrator of a stock farm, or the like; here, an administrator of the stock farm S) has the birth registered and receives an individual identification number of the beef cattle A. The individual identification number is, for example, a ten-digit number which includes a specific serial number for each production area and each administrator. The individual identification number is assigned to the beef cattle A as an ear mark, for example.

At this time, a radio chip where the individual identification number has been written into a predetermined block in advance is incorporated in the ear mark. A semiconductor device of the present invention is used as a radio chip incorporated in the ear mark, whereby falsification of the individual identification number can be prevented. Of course, the individual identification number may be written after being assigned to the beef cattle A as an ear mark A; however, the radio chip where the individual identification number is written in advance is preferably assigned to each beef cattle, because such an error that there exist individual identification numbers which are overlapping with each other by writing a wrong number can be prevented, which leads to easy administration.

It is preferable to further write a name, sex, a type, blood, and the like into the radio chip incorporated in the ear mark. Accordingly, it is preferable that a plurality of blocks where data has not been written are present in the radio chip and necessary data be written into the blocks where data has not been written as needed. Of course, after writing data into the blocks where data has not been written as needed, the blocks are judged as the blocks where the data has been written. By applying the present invention to the radio chip incorporated in the ear mark, falsification of data once written can be prevented. Note that the content of data written into the radio chip which is incorporated in the ear mark is read by a transmitting and receiving device such as a reader/writer and registered in a management server.

When the beef cattle A is moved to another administrator (a fattening center, or the like) before it is slaughtered, data such as the place where it is moved is written into the block where data has not been written of the radio chip as needed. Note that when data is newly written into the radio chip, the data is read by a transmitting and receiving device such as a reader/writer and the content thereof is registered in a management server.

The beef cattle A is slaughtered in a slaughter house T to become beef. The slaughtered beef cattle A is generally distributed from the slaughter house T to a meat processor and the like as a beef carcass A'. The data written into the radio chip to a step of the slaughter is copied and a radio chip where the copied data is written is newly attached to the beef carcass A' of the beef cattle A. When there exist a plurality of beef carcasses A', radio chips where the copied data is written are attached to all the beef carcasses A'. Needless to say, by also applying the present invention to the radio chips where the copied data is written, falsification of the data is prevented. A slaughterer of the beef cattle A (an administrator of an abattoir or a meat center, or the like; here, an administrator of the slaughter house T) writes the date of slaughter, the place of slaughter, and the like into a block where data has not been written of the radio chip attached to the beef carcass A'. Of course, the radio chip may be attached to the target beef carcass A' after the data such as the date of slaughter is written into the radio chip where the copied data is written. A grade, weight, a shipment destination, the date of shipment, of the beef carcass A', or the like is also written into the block where data has not been written. Note that the content of the data written into the radio chip is read by a transmitting and receiving device such as a reader/writer and is registered in a management server.

The beef carcass A' is processed into part beef A" of the beef carcass A' by a food processor U. The processed beef carcass A' is distributed as a plurality of part beef A" of the beef carcass A' from the food processor U to retailers, specific cooking providers, or the like. The data written in the radio chip which is attached to the beef carcass A' is copied and a radio chip where the copied data is written is newly attached to each part beef A" of the beef carcass A'. Of course, by also applying the present invention to the radio chip where the copied data is written, falsification of the data is prevented. A processor of the beef carcass A' (here, the food processor U) writes a weight, a purchaser, the date of purchase, a seller, the date of sales of the part beef A" of the beef carcass A', or the like into the block where data has not been written. Note that the content of the data written into the radio chip is read by a transmitting and receiving device such as a reader/writer and is registered in a management server.

The part beef A" of the beef carcass A' is processed into beef A''' which is smaller than the part beef A" of the beef carcass A' by a retailer V and sold to consumers W. The retailer V copies the data written in the radio chip which is attached to the part beef A" of the beef carcass A' and further writes a purchaser, the date of purchase, or the like into the block where data has not been written into a radio chip where the copied data is written. In selling each beef A''' which is smaller than the part beef A" of the beef carcass A', the radio chip is attached to each beef A''' which is smaller than the part beef A" of the beef carcass A'. Of course, by also applying the present invention to the radio chip where the copied data is written, falsification of the data is prevented. The content of the data written into the radio chip is read by a transmitting and receiving device such as a reader/writer and is registered in a management server. In this manner, in distribution steps from the stock farm S to the retailer V, data can be written in a block where data has not been written as needed. Further, a block where data has not been written, after writing data thereto, is judged as a block where data has been written; therefore, there is no possibility that the data is falsified.

The consumer W who purchased or is considering purchasing the beef A''' which is smaller than the part beef A" of the beef carcass A' can see the data written into the block where the data has been written of the radio chip attached to the beef A''' which is smaller than the part beef A" of the beef carcass A', with the use of a data reference system provided in a store. As the a data reference system, for example, the data written into the radio chip can be read by a transmitting and receiving device such as a reader/writer and the data written into the block where the data has been written can be displayed on a screen of a personal computer which interfaces with the transmitting and receiving device and the management server.

A radio chip to which the present invention is applied is used for traceability of the beef cattle and the beef which are described here. The present invention can prevent falsification of data once written. Accordingly, when the present invention is applied to a production step and a distribution step in each of which an administrator, or the like is different, such as traceability of beef cattle and beef, falsification such as rewriting the data in the previous step can be prevented when the administrator changes. In the above-described example, the retailer V can be prevented from committing an injustice such as rewriting a place of origin such as a birthplace, a grade of beef, or the like for false labeling to sell the beef at high cost. Thus, the consumer W can see accurate data and can be prevented from suffering disadvantage due to false labeling. Note that an example in which the present invention is applied to traceability of beef cattle and beef is described here; however, needless to say, the present invention can be applied widely to other food, products, craftwork, or the like.

Further, it is also effective to use a radio chip to which the present invention is applied for inspection and management of baggage at an airport, or the like. As described above, the radio chip to which the present invention is applied has a structure in which it is possible to write new data in a block where data has not been written, but it is impossible to rewrite data once written (data in the block where the data has been written). Accordingly, when data of an owner of baggage is input to the radio chip, since others cannot rewrite the data of the owner, theft or the like can be prevented. Furthermore, in a case of inputting the inspection result of a baggage inspection system, even if a hazardous material is to be carried into an airplane, data which means that "it is impossible to carry this into an airplane" which is once written cannot be rewritten, which leads to securing of safety.

As described above, in the radio chip to which the present invention is applied, data which should not be falsified is written by making the state where data has been written, such as "the second state" or "the third state", correspond to binary data. By making no memory element where data has not been written be present, falsification of the data can be prevented. Of course, it is possible to leave a memory element which is in a non-writing state and it is also possible to write data additionally using the memory element which is in a non-writing state.

Note that this embodiment can be freely combined with any of the other embodiment modes and embodiment.

This application is based on Japanese Patent Application serial no. 2007-323241 filed with Japan Patent Office on Dec. 14, 2007, the entire contents of which are hereby incorporated by reference.

What is claimed is:

1. A memory device comprising:
   an antifuse memory element comprising:
   a first electrode;
   an insulating layer over the first electrode;
   a silicon layer over the insulating layer; and
   a second electrode,
   a first driver circuit which writes a first data to the antifuse memory element being in a first state so that a potential of the first electrode is higher than a potential of the second electrode, whereby the antifuse memory element being in a second state is obtained, and
   a second driver circuit which writes a second data to the antifuse memory element being in the first state so that a potential of the second electrode is higher than a potential of the first electrode, whereby the antifuse memory element being in a third state is obtained, and
   wherein $R1>R2>R3$ is satisfied when a resistance of the antifuse memory element being in the first state is $R1$, a resistance of the antifuse memory element being in the second state is $R2$, and a resistance of the antifuse memory element being in the third state is $R3$,
   wherein the antifuse memory element being in the first state is an initial state,
   wherein at least a part of the silicon layer of the antifuse memory element being in the second state is a silicide layer, and
   wherein the first electrode and the second electrode of the antifuse memory element being in the third state are shorted.

2. The memory device according to claim 1, wherein each of the first electrode and the second electrode includes tungsten or titanium.

3. The memory device according to claim 1, wherein the silicon layer includes amorphous silicon.

4. The memory device according to claim 1, wherein the antifuse memory element, the first driver circuit and the second driver circuit are formed over a substrate.

5. The memory device according to claim 1, further comprising an antenna.

6. The memory device according to claim 1, wherein the antifuse memory element being in the second state is not capable of changing to the first state, and
   wherein the antifuse memory element being in the third state is not capable of changing to the first state and the second state.

7. A memory device comprising:
an antifuse memory element comprising:
    a first electrode;
    an insulating layer over the first electrode;
    a silicon layer over the insulating layer, and
    a second electrode,
a first driver circuit which writes a first data to the antifuse memory element being in a first state so that a potential of the first electrode is higher than a potential of the second electrode, whereby the antifuse memory element being in a second state is obtained, and
a second driver circuit which writes a second data to the antifuse memory element being in the first state so that a potential of the second electrode is higher than a potential of the first electrode, whereby the antifuse memory element being in a third state is obtained, and
wherein R1>R2>R3 is satisfied when a resistance of the antifuse memory element being in the first state is R1, a resistance of the antifuse memory element being in the second state is R2, and a resistance of the antifuse memory element being in the third state is R3,
wherein the antifuse memory element being in the first state is an initial state,
wherein at least a part of the silicon layer of the antifuse memory element being in the second state is a silicide layer,
wherein the first electrode and the second electrode of the antifuse memory element being in the third state are shorted, and
wherein the silicon layer comprises amorphous silicon containing hydrogen at greater than or equal to 2 atomic % and less than or equal to 20 atomic %.

8. The memory device according to claim 7, wherein each of the first electrode and the second electrode includes tungsten or titanium.

9. The memory device according to claim 7, wherein the antifuse memory element, the first driver circuit and the second driver circuit are formed over a substrate.

10. The memory device according to claim 7, further comprising an antenna.

11. The memory device according to claim 7, wherein the antifuse memory element being in the second state is not capable of changing to the first state, and
    wherein the antifuse memory element being in the third state is not capable of changing to the first state and the second state.

12. The memory device according to claim 7, wherein the insulating layer includes silicon oxynitride.

13. A memory device comprising:
an antifuse memory element comprising:
    a first electrode;
    an insulating layer over the first electrode;
    a silicon layer over the insulating layer; and
    a second electrode,
a first driver circuit which writes a first data to the antifuse memory element being in a first state so that a potential of the first electrode is higher than a potential of the second electrode, whereby the antifuse memory element being in a second state is obtained, and
a second driver circuit which writes a second data to the antifuse memory element being in the first state so that a potential of the second electrode is higher than a potential of the first electrode, whereby the antifuse memory element being in a third state is obtained,
wherein R1>R2>R3 is satisfied when a resistance of the antifuse memory element being in the first state is R1, a resistance of the antifuse memory element being in the second state is R2, and a resistance of the antifuse memory element being in the third state is R3,
wherein the antifuse memory element being in the second state corresponds to the antifuse memory element in which one of "0" and "1" is written,
wherein the antifuse memory element being in the third state corresponds to the antifuse memory element in which the other of "0" and "1" is written,
wherein the antifuse memory element being in the first state is an initial state,
wherein at least a part of the silicon layer of the antifuse memory element being in the second state is a silicide layer, and
wherein the first electrode and the second electrode of the antifuse memory element being in the third state are shorted.

14. The memory device according to claim 13, wherein each of the first electrode and the second electrode includes tungsten or titanium.

15. The memory device according to claim 13, wherein the silicon layer includes amorphous silicon.

16. The memory device according to claim 13, wherein the antifuse memory element, the first driver circuit and the second driver circuit are formed over a substrate.

17. The memory device according to claim 13, further comprising an antenna.

18. The memory device according to claim 13, wherein the antifuse memory element being in the second state is not capable of changing to the first state, and
    wherein the antifuse memory element being in the third state is not capable of changing to the first state and the second state.

19. The memory device according to claim 13, wherein the insulating layer includes silicon oxynitride.

* * * * *